US009465053B2

(12) United States Patent
Konno et al.

(10) Patent No.: US 9,465,053 B2
(45) Date of Patent: Oct. 11, 2016

(54) OPTICAL FIBRE BIREFRINGENCE COMPENSATION MIRROR AND CURRENT SENSOR

(75) Inventors: Yoshihiro Konno, Tokyo (JP); Masaru Sasaki, Tokyo (JP)

(73) Assignee: ADAMANT KOGYO CO., LTD., Tokyo (JP)

( * ) Notice: Subject to any disclaimer, the term of this patent is extended or adjusted under 35 U.S.C. 154(b) by 990 days.

(21) Appl. No.: 13/699,772

(22) PCT Filed: May 25, 2011

(86) PCT No.: PCT/JP2011/002919
§ 371 (c)(1),
(2), (4) Date: Nov. 26, 2012

(87) PCT Pub. No.: WO2011/148634
PCT Pub. Date: Dec. 1, 2011

(65) Prior Publication Data
US 2013/0069628 A1    Mar. 21, 2013

(30) Foreign Application Priority Data
May 27, 2010    (JP) .................. 2010-134473

(51) Int. Cl.
*G01R 19/00*  (2006.01)
*G01R 15/24*  (2006.01)
*G02B 27/28*  (2006.01)
*G02B 6/27*   (2006.01)

(52) U.S. Cl.
CPC ............. *G01R 19/00* (2013.01); *G01R 15/246* (2013.01); *G02B 6/274* (2013.01); *G02B 27/283* (2013.01); *G02B 27/288* (2013.01)

(58) Field of Classification Search
CPC ... G01R 15/245; G01R 15/246; G01R 19/32
See application file for complete search history.

(56) References Cited

U.S. PATENT DOCUMENTS 6,122,415 A * 9/2000 Blake ................... G01R 15/242
                                                              250/227.17
2005/0083033 A1    4/2005 Kurosawa et al.
(Continued)

FOREIGN PATENT DOCUMENTS

JP    U-7-41507    7/1995
JP    H10-206467 A    8/1998
(Continued)

OTHER PUBLICATIONS

Written Opinion of the International Searching Authority issued in International Application No. PCT/JP2011/002919 on Sep. 6, 2011 (with translation).
(Continued)

*Primary Examiner* — Huy Q Phan
*Assistant Examiner* — Adam Clarke
(74) *Attorney, Agent, or Firm* — Oliff PLC

(57) ABSTRACT

Disclosed is an optical fiber birefringence compensation mirror. Also disclosed is a current sensor wherein vibration resistance has been increased due to the optical connection of the optical fiber birefringence compensation mirror. The optical fiber birefringence compensation mirror includes: an optical fiber, a birefringence element, a lens, a magnet, a Faraday rotator, and a mirror. From the light incidence/emission end surface of the optical fiber, the birefringence element, Faraday rotator, and mirror are arranged in said order. Light comes in from the optical fiber, and is separated into two linearly polarised lights by the birefringence element. The polarisation planes of the two linearly polarised lights are rotated by the Faraday rotator, and the two linearly polarised lights are point-symmetrically reflected at one point by the mirror, then again rotated by the Faraday rotator, then re-combined into one light by the birefringence element and made to enter the optical fiber.

6 Claims, 10 Drawing Sheets

(56) References Cited

U.S. PATENT DOCUMENTS

| | | | | |
|---|---|---|---|---|
| 2007/0273358 | A1* | 11/2007 | Kurosawa | G01R 15/246 324/96 |
| 2009/0214152 | A1* | 8/2009 | Huang | G01R 15/246 385/11 |
| 2010/0309473 | A1* | 12/2010 | Sanders | G01R 15/246 356/460 |

FOREIGN PATENT DOCUMENTS

| JP | A-10-319051 | 12/1998 |
|---|---|---|
| JP | A-2008-65111 | 3/2008 |
| JP | A-2010-107490 | 5/2010 |
| SU | 1315797 A1 | 6/1987 |
| WO | WO 03/075018 A1 | 9/2003 |

OTHER PUBLICATIONS

Apr. 14, 2015 Office Action issued in Russian Patent Application No. 2012157326/28(090356).

Sep. 6, 2011 International Search Report issued in International Patent Application No. PCT/JP2011/002919 (with translation).

Jul. 16, 2015 Office Action issued in Russian Patent Application No. 2012157326.

\* cited by examiner (A)

(D)

(B)

(E)

(C)

(F)

(A)

(C)

(B)

(D)

(E)

(G)

(F)

(H)

\*: Frequency
\*\*: Amplitude

\*: Frequency
\*\*: Amplitude

\*: Frequency
\*\*: Amplitude

\*: Frequency
\*\*: Amplitude

OPTICAL FIBRE BIREFRINGENCE COMPENSATION MIRROR AND CURRENT SENSOR

TECHNICAL FIELD

The present invention relates to an optical fibre birefringence compensation mirror used for a current sensor sensing a value of a current of a power system, a magnetic field sensor, a quantum cryptography device transmitting quantum ciphers between a transmitting unit and a receiving unit connected via a transmission line in an optical communication field, an optical switch, a light source, an amplifier, an interferometer, an add-drop, and the like and the current sensor.

BACKGROUND ART

In the related art, a winding-type transformer has been widely used for measuring a current of a power system in power facilities. However, the winding-type transformer is greatly enlarged as a to-be-measured system voltage is increased, and thus, there is a problem in that costs and installation space are increased. Particularly, in a gas insulation switching apparatus using an insulating gas, which is called GIS (Gas Insulation Switch), since miniaturization and space saving are greatly required, it is difficult to install a large-sized winding-type transformer therein.

For this reason, in terms of miniaturization, space saving, high insulation property, and noise resistance, various current sensors which are configured to include an optical fibre installed to surround the current conductor and perform current measurement by using the Faraday effect of the optical fibre have been proposed and used in the related art. In the current sensor, a linearly polarized light beam is incident on the optical fibre; the optical fibre is configured to surround the conductor through which the to-be-measured current flows; and due to the Faraday effect of the optical fibre, a polarization plane of the linearly polarized light beam in the optical fibre is rotated by a magnetic field generated in proportion to a current. At this time, the rotation angle of the polarization plane is proportional to a magnitude of the to-be-measured current. Therefore, by measuring the rotation angle, the magnitude of the current can be obtained.

FIG. 15 is a schematic diagram illustrating a current sensor disclosed in Patent Literature 1 as an example of a current sensor using the Faraday effect of an optical fibre. The current sensor 100 is configured to include an optical circulator 101, a birefringent element 102, a Faraday rotator 103, and an optical fibre 104 for a sensor. The optical fibre 104 is disposed along the outer circumference of the conductor 105 through which a to-be-measured current flows. The Faraday rotator 103 is installed at the one end of the optical fibre 104, and a mirror 106 is installed at the other end thereof. In addition, the birefringent element 102 and the optical circulator 101 are connected to each other by the optical fibre. The optical circulator 101 is connected in such a direction that the light beam of the light source 107 transmits toward the optical fibre 104 side.

The light beam which is emitted from the light source 107 to be incident through the optical fibre 108 and the optical circulator 101 on the birefringent element 102 is converted into a linearly polarized light beam by the birefringent element 102 to be incident on the Faraday rotator 103. The Faraday rotator 103 is configured to include a magnet 109 and a ferromagnetic garnet 110 which is magnetically saturated by the magnet 109 so as to rotate the polarization plane of the light beam transmitting through the ferromagnetic garnet 110 by 22.5 degrees. The linearly polarized light beam transmitting through the Faraday rotator 103 is incident on the optical fibre 104 to be subject to Faraday rotation by a magnetic field generated by the to-be-measured current flowing through the conductor 105, so that the polarization plane of the linearly polarized light beam is rotated by a rotation angle which is proportional to the intensity of the magnetic field.

The light beam propagating the optical fibre 104 is further reflected by the mirror 106, and when the light beam propagates the optical fibre 104 again, the light beam is rotated due to the Faraday effect again by the magnetic field to be incident on the Faraday rotator 103 again. Since the light beam transmits through the Faraday rotator 103 again, the polarization plane is further rotated by 22.5 degrees, so that the polarization plane is rotated by 45 degrees in reciprocating paths by the Faraday rotator 103. The light beam transmitting through the Faraday rotator 103 propagates the birefringent element 102 again to be divided into two linearly polarized light beams of which the polarization directions are perpendicular to each other. The one divided linearly polarized light beam is received by a light-receiving element 112 through the optical circulator 101 and an optical fibre 111 to be converted into an electric signal S1. In addition, the other linearly polarized light beam is received by a light-receiving element 114 through an optical fibre 113 to be converted into an electric signal S2.

Since the light amount received by the light-receiving elements 112 and 114 is changed according to the Faraday rotation angle occurring in the linearly polarized light beam propagating the optical fibre 104, the electric signals S1 and S2 are processed by a signal processing circuit 115 by taking into consideration the change to obtain the Faraday rotation angle generated by the optical fibre 104. Next, the to-be-measured current is calculated from the obtained Faraday rotation angle.

In addition, since power transmission-transformation facilities such as the above-described GIS are configured to have a large magnitude of the current, in order to detect the large-magnitude current by the optical fibre, a quartz-based optical fibre having a large maximum measurement current value needs to be used.

However, in the case where the quartz-based optical fibre is used as the optical fibre 104 performing current detection, linear birefringence occurs due to a stress generated from bending or vibration, and thus the propagating linearly polarized light beam is converted to have an elliptic form, so that measurement error is increased. In other words, if external vibration is applied to a current sensor such as the current sensor 100 using the Faraday effect of the optical fibre, there is a problem in that the measurement result of the to-be-measured current is greatly changed due to photoelasticity of the optical fibre.

For example, FIG. 16 illustrates an example where the measurement result is changed according to operations of a breaker in the above-described GIS. In a steady-state case where a system frequency is 60 Hz, the measurement result is a waveform illustrated in FIG. 16($a$). If vibration is applied in the steady state, the measurement result is greatly changed as illustrated in FIG. 16($b$).

Therefore, a low birefringence optical fibre containing lead oxide is used as the optical fibre 104. The reason why the optical fibre containing lead oxide is used is that a photoelasticity coefficient thereof is much smaller than that of the quartz-based optical fibre and thus, the propagating polarized light beam is not easily influenced by the stress due to bending or vibration.

However, since Verdet constant indicating Faraday rotation ability of the optical fibre containing lead oxide is about five times Verdet constant of the quartz-based optical fibre, the maximum detection current thereof is smaller than that of the quartz-based optical fibre, so that the optical fibre containing lead oxide has disadvantage in measurement of a large-magnitude current.

Therefore, as means for suppressing the above-described problems occurring in the optical fibre, a method of replacing a mirror 106 with the Faraday mirror having the Faraday rotator and optically connecting the Faraday mirror to the other end of the optical fibre 104 is considered. For example, Patent Literature 2 discloses an example of the Faraday mirror having the Faraday rotator.

FIG. 18 illustrates a configuration of a Faraday mirror 123 disclosed in Patent Literature 2. The Faraday mirror 123 is configured by inserting an optical fibre 126, an optical fibre 127, and a converging beam series integrating terminal having a spherical portion 128 at the distal end into a central hole of an optical fibre holder 124 through a ferrule 125, allowing the spherical portion 128 to protrude, disposing a 45-degree Faraday rotator 129 and a mirror 130 to face each other, and being sealed by a cap 132 to externally enclosing a magnet 131 for magnetizing the Faraday rotator 129. If a direction in which a light beam propagates from the optical fibre 127 to the mirror 130 is defined as a forward direction and a direction in which a light beam propagates from the mirror 130 to the optical fibre 127 is defined as a backward direction. In the forward direction, a polarization plane of the light beam which propagates through the optical fibre 127 and is emitted from the spherical portion 128 is rotated by 45 degrees by the Faraday rotator 129 and is reflected by the mirror 130. In addition, in the backward direction, the light beam transmits through the Faraday rotator 129 again, so that the polarization plane thereof is further rotated by 45 degrees. Therefore, the light beam is returned to the optical fibre 127 in the state where the polarization plane in the backward direction is rotated by 90 degrees from the polarization plane of the light beam emitted from the optical fibre 127 and the spherical portion 128 in the forward direction.

However, although the vibration characteristic of the current sensor including the Faraday mirror 123 is improved in comparison with the vibration characteristic of the current sensor including the mirror 106, the vibration characteristic is not sufficient for highly accurate measurement, and a temperature characteristic thereof is deteriorated. The reason is as follows. The Faraday rotator 129 has a temperature characteristic and a wavelength characteristic; there is a limitation in the thickness processing accuracy for determining the Faraday rotation angle of 45 degrees; and at the temperature and wavelength during the measurement, when the light beam reciprocates the Faraday rotator, the Faraday rotation angle of the polarization plane thereof is shifted from 90 degrees, so that the birefringence of the optical fibre cannot be completely compensated. In addition, the wavelength and temperature characteristics of the measurement accuracy of the current sensor are also deteriorated. FIG. 19 illustrates temperature dependency of the measured value of the to-be-measured current output from the current sensor connected to the Faraday mirror 123 as a ratio error-temperature characteristic. It can be seen from FIG. 19 that, although the ratio error is in minimum at the temperature of about 35° C., if the temperature is decreased or increased from 35° C., the change width of the ratio error is non-linearly increased, so that the measured value of the to-be-measured current of the current sensor is changed due to the temperature characteristic of the Faraday rotator 129.

Therefore, as means for suppressing the above-described problems occurring in the optical fibre 104, a method of not using the Faraday rotator and optically connecting a polarization plane rotation mirror having a wavelength plate to the other end of the optical fibre 104 instead of the mirror 106 is considered. Patent Literature 3 discloses an example of the polarization plane rotation mirror having a λ/4 wavelength plate.

FIG. 17 illustrates a configuration of a polarization plane rotation mirror disclosed in Patent Literature 3. In a polarization plane rotation mirror 116, if a light beam is emitted from a light incidence/emission end surface 117a of an optical fibre 117 and is incident on a first birefringent element 118, the light beam is divided into two linearly polarized light beams of an ordinary ray, or beam and an extraordinary ray, or beam of which polarization directions are perpendicular to each other. Next, the two linearly polarized light beams are incident on a second birefringent element 119. Since directions of the crystal axes of the optical planes of the first birefringent element 118 and a second birefringent element 119 are set to be different from each other by 90 degrees, the light beam transmitting through the first birefringent element 118 as the ordinary ray becomes an extraordinary ray in the second birefringent element 119 and is shifted in the x axis direction of FIG. 17. Therefore, in the case where the two linearly polarized light beams transmit through the first birefringent element 118 and the second birefringent element 119, the two linearly polarized light beams necessarily take optical paths of both of the ordinary ray and the extraordinary ray, and if the first birefringent element 118 and the second birefringent element 119 have the same direction of the crystal axis and the same thickness, the optical path lengths are the same. Since the two polarized components of the ordinary ray and the extraordinary ray are shifted by the same distance by the two birefringent elements 118 and 119, the optical path length difference between the two light beams generated during the division of the first birefringent element 118 is solved before the light beams are reflected by the mirror 122.

Next, the two linearly polarized light beams are incident on the λ/4 wavelength plate 120 so as to be converted into two circularly polarized light beams of which rotation directions of the distal ends of the electric vectors are different. The two circularly polarized light beams emitted from the λ/4 wavelength plate 120 are condensed by a lens 121 and are reflected at one point R on a surface of a mirror 122 in point symmetry; and the optical paths of the circularly polarized light beams are exchanged before and after the reflection; and the rotation directions of the circularly polarized light beams are reversed due to the reflection.

The reflected circularly polarized light beams transmit through the λ/4 wavelength plate 120 again so as to be converted into two linearly polarized light beams of which vibration directions of the electric vectors are different from each other by 90 degrees. At this time, the linearly polarized light beams in the x and y directions in the optical path (forward path) before the reflection becomes the linearly polarized light beams in the y and x directions in the optical path (backward path) after the reflection, respectively. The two linearly polarized light beams re-transmit through the second birefringent element 119 and the first birefringent element 118 and are re-combined as one light beam. The light beam formed through the re-combination is incident on the optical fibre 117.

Since the two light beams are shifted by the same distance by the two birefringent elements 118 and 119 after the reflection by the mirror 122 before the incidence on the optical fibre 117, the optical path length difference between the two light beams which are reflected by the mirror 122 is solved before the re-combined light beam is incident on the optical fibre 117.

In this manner, according to the polarization plane rotation mirror 116, with respect to an arbitrary polarized light beam emitted from the optical fibre 104, the polarization principal axis is rotated by 90 degrees, and in the case where an elliptically polarized component exists, the component is changed into a polarized light beam having the reverse rotation direction, that is, a polarized light beam located at an antipodal point on the Poincare sphere, i.e. a point directly opposite to the other around a circle on the sphere, to be incident on the optical fibre 104, so that the birefringence occurring due to the optical fibre 104 is compensated for, and stabilized measurement of the current sensor 100 can be performed.

CITATION LIST

Patent Literature

Patent Literature 1: JP 10-319051 A
Patent Literature 2: JP 7-41507 Y (Utility model)
Patent Literature 3: JP 2008-65111 A

DISCLOSURE OF THE INVENTION

Problem to be Solved by the Invention

However, in the polarization plane rotation mirror 116 which does not use the Faraday rotator, there is a problem in that during the alignment of finding an optimal coupling position during assembling it is difficult to determine which degrees the coupling peak position occurs at and which position is the optimal coupling position and it is difficult to perform the assembling. The reason is estimated as follows. When the two circularly polarized light beams are reflected at one point by the mirror 122, the rotation direction of the distal ends of the electric vectors are reverse to each other, so that interference is estimated to occur between the circularly polarized light beams.

The present invention has been made in view of the above problem, and an object of the invention is to provide an optical fibre birefringence compensation mirror capable of allowing alignment assembling to be easily performed by solving occurrence of many coupling peak positions, capable of improving vibration resistance of a current sensor by compensating for birefringence occurring in an optical fibre for the current sensor, and capable of detecting a large-magnitude current of the current sensor and a current sensor of which vibration resistance is improved by optically connecting the optical fibre birefringence compensation mirror thereto.

Means for Solving Problem

The objects are achieved by the present invention hereinafter. According to an aspect of the present invention, there is provided an optical fibre birefringence compensation mirror comprising: an optical fibre; a birefringent element; a lens; a magnet; a Faraday rotator which is applied with a magnetic field from the magnet to be magnetically saturated and has a Faraday rotation angle of 45 degrees; and a mirror, wherein components of the birefringent element, the Faraday rotator, and the mirror are disposed in the order of the birefringent element, the Faraday rotator, and the mirror from a light incidence/emission end surface of the optical fibre, the optical fibre is of a single mode type, a light beam propagating through the optical fibre is divided into two perpendicular linearly polarized light beams of a ordinary ray, or beam and an extraordinary ray, or beam by the birefringent element to be condensed by the lens, the two linearly polarized light beams transmit through the Faraday rotator, therefore polarization planes thereof are rotated by 45 degrees, and the two linearly polarized light beams are reflected at one point on a surface of the mirror in point symmetry, the two reflected linearly polarized light beams re-transmit through the Faraday rotator, therefore the polarization planes of the two linearly polarized light beams are further rotated by 45 degrees, in which the two linearly polarized light beams are incident on the birefringent element again, consequently one light beam is re-combined, and the re-combined light beam is incident on the optical fibre.

In addition, the optical fibre birefringence compensation mirror according the present invention is characterized in that the shift amount of the extraordinary ray in the birefringent element of the optical fibre birefringence compensation mirror is equal to or larger than twice a mode field diameter of the optical fibre.

In addition, according to an aspect of the present invention, there is provided an optical fibre birefringence compensation mirror comprising: an optical fibre; a first birefringent element; a second birefringent element; a lens; a magnet; a Faraday rotator which is applied with a magnetic field from the magnet to be magnetically saturated and has a Faraday rotation angle of 45 degrees; and a mirror, wherein components of the first birefringent element, the second birefringent element, the Faraday rotator, and the mirror are disposed in the order of the first birefringent element, the second birefringent element, the Faraday rotator, and the mirror from a light incidence/emission end surface of the optical fibre, the optical fibre is of a single mode type, the direction of the crystal axis of an optical plane of the second birefringent element is set to be different by 90 degrees from the direction of the crystal axis of an optical plane of the first birefringent element, a light beam propagating through the optical fibre is divided into two perpendicular linearly polarized light beams of a ordinary ray, or beam and an extraordinary ray, or beam by the first birefringent element, when the two linearly polarized light beams transmitting through the first birefringent element transmit through the second birefringent element, the light beam transmitting through the first birefringent element as the ordinary ray transmits as the extraordinary ray and the light beam transmitting through the first birefringent element as the extraordinary ray transmit as the ordinary ray, and the two linearly polarized light beams are condensed by the lens, a shift amount of the extraordinary ray during the transmission through the first birefringent element and a shift amount of the extraordinary ray during the transmission through the second birefringent element are set to be the same, the two linearly polarized light beams transmit through the Faraday rotator, therefore polarization planes thereof are rotated by 45 degrees, and the two linearly polarized light beams are reflected at one point on a surface of the mirror in point symmetry the two reflected linearly polarized light beams re-transmit through the Faraday rotator, therefore the polarization planes of the two linearly polarized light beams are further rotated by 45 degrees, when the two linearly polarized light beams transmitting through the Faraday rotator transmit through the second birefringent element, only one linearly polarized light beam is shifted, the two linearly polarized light beams are incident on the first birefringent element again, and when the two linearly polarized light beams transmitting through the second birefringent element transmit through the first birefringent element, the light beam transmitting through the second birefringent element as the ordinary ray transmits as the extraordinary ray and the light beam transmitting through the second birefringent element as the extraordinary ray transmits as the ordinary ray, consequently the only one linearly polarized light beam is shifted and the two linearly polarized light beams is re-combined as one light beam, and the re-combined light beam is incident on the optical fibre.

In addition, the optical fibre birefringence compensation mirror according the present invention is characterized in that a sum of the shift amount of the extraordinary ray in the first birefringent element of the optical fibre birefringence compensation mirror and the shift amount of the extraordinary ray in the second birefringent element thereof is equal to or larger than twice a mode field diameter of the optical fibre.

In addition, the optical fibre birefringence compensation mirror according the present invention is characterized in that the optical path length difference between the two linearly polarized light beams generated through the division of the ordinary ray and the extraordinary ray at the time of transmitting the second birefringent element of the optical fibre birefringence compensation mirror is set to be the same as the optical path length difference between the two linearly polarized light beams generated through the division of the ordinary ray and the extraordinary ray at the time of transmitting the first birefringent element.

According to the invention, there is provided a current sensor, wherein the optical fibre of the optical fibre birefringence compensation mirror is optically connected to an optical fibre for the current sensor which is installed to a conductor flowing a current and measures the current flowing through the conductor.

Effect of the Invention

According to the optical fibre birefringence compensation mirror disclosed in claim 1 or 3 of the present invention, the optical path is configured so that the light beam emitted from the optical fibre is divided into the two linearly polarized light beams and the two perpendicular linearly polarized light beams are reflected in point symmetry. In other words, during the point-symmetric reflection by the mirror, since the polarization directions of the two linearly polarized light beams are perpendicular to each other, the interference is solved, so that occurrence of a plurality of coupling peak positions can be prevented. Therefore, it is possible to easily find the optimal coupling positions, so that it is possible to easily perform an alignment assembling process.

In addition, in the optical fibre birefringence compensation mirror disclosed in claim 1, when the two linearly polarized light beams transmit through the birefringent element twice in the reciprocal path, the ordinary ray and the extraordinary ray are exchanged through the reflection by the mirror and the 90-degree rotation of the polarization plane by the Faraday rotator, with respect to an arbitrary polarized light beam emitted from the optical fibre, the polarized light beam located at an antipodal point on the Poincare sphere, i.e. a point directly opposite to the other around a circle on the sphere, is incident on the optical fibre. Therefore, the birefringence occurring due to the optical fibre can be compensated for.

In addition, in the optical fibre birefringence compensation mirror disclosed in claim 3, the two linearly polarized light beams are shifted by the same distance by the two birefringent elements. Therefore, the optical path length difference between the two linearly polarized light beams generated during the division of the first birefringent element is compensated for by the second birefringent element, so that the optical path length difference is solved before the two linearly polarized light beams are incident on the lens. Therefore, deterioration in coupling efficiency caused by focus shifting of a lens is prevented. In addition, since the optical path is configured so that, after the optical path length difference is compensated for, the ordinary ray and the extraordinary ray are exchanged through the reflection by the mirror and the 90-degree rotation of the polarization plane by the Faraday rotator, with respect to an arbitrary polarized light beam emitted from the optical fibre, the polarized light beam located at an antipodal point on the Poincare sphere is incident on the optical fibre. Therefore, the birefringence occurring due to the optical fibre can be compensated for.

In addition, in the optical fibre birefringence compensation mirror disclosed in claim 1 or 3, the Faraday rotator is used. Even if the Faraday rotator has the temperature characteristic and the wavelength characteristic, the perpendicularity of the polarization planes of the two linearly polarized light beams is preserved, so that birefringence occurring due to the optical fibre is compensated for.

In addition, according to the optical fibre birefringence compensation mirror disclosed in claim 2 or 4, although the sum of the Faraday rotation angles of the two linearly polarized light beams, in which the Faraday rotation occurs in the reciprocation the Faraday rotator, is shifted from 90 degrees since the Faraday rotator has the temperature characteristic and the wavelength characteristic, the linearly polarized light beams having the component shifted from 90 degrees divided by the birefringent element can be prevented from being incident on the optical fibre.

In addition, according to the optical fibre birefringence compensation mirror disclosed in claim 5, the optical path length difference between the two linearly polarized light beams generated during the division of the first birefringent element can be more securely compensated for by the second birefringent element.

In addition, according to the current sensor disclosed in claim 6, since the optical fibre birefringence compensation mirror according to any one of claims 1 to 5 is optically connected, the birefringence of the optical fibre is compensated for, so that a change in measurement result due to vibration caused by photoelasticity of the optical fibre for sensors is suppressed, and vibration resistance is improved.

In addition, since it has excellent vibration resistance, a quartz-based optical fibre having birefringence higher than that of an optical fibre containing lead oxide can be used for the optical fibre for sensors, so that it is possible to form a current sensor which can detect a large-magnitude current.

MODES FOR CARRYING OUT THE INVENTION

<First Embodiment>

Figure 1:
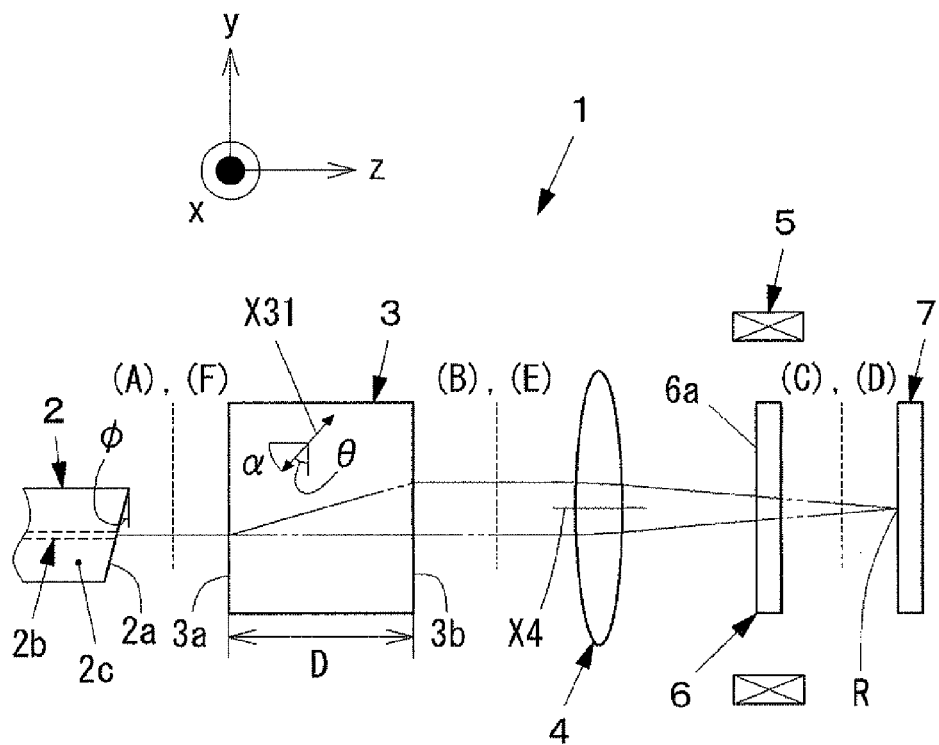
FIG. 1 is a diagram illustrating a configuration of an optical fibre birefringence compensation mirror according to a first embodiment of the present invention.
Figure 2:
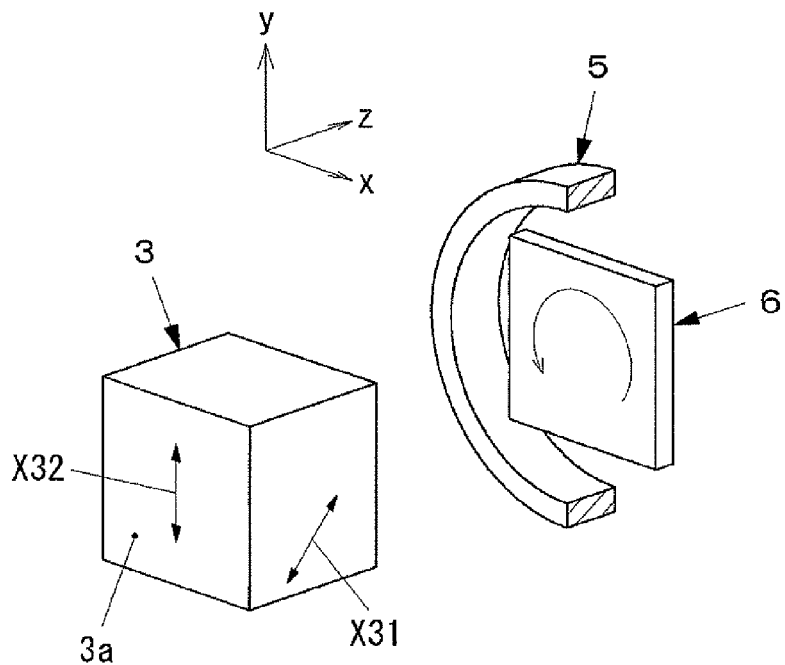
FIG. 2 is a perspective view illustrating arrangement of a birefringent element, a Faraday rotator, and a magnet of the optical fibre birefringence compensation mirror of FIG. 1.

Hereinafter, an optical fibre birefringence compensation mirror according to a first embodiment of the present invention will be described in detail with reference to FIGS. 1 and 2. In the figures, x axes, y axes, and z axes are in one-to-one correspondence. In FIG. 1, the optical fibre birefringence compensation mirror 1 is configured to include an optical fibre 2, a birefringent element 3 having two planes 3a and 3b parallel to each other, a lens 4, a magnet 5, a Faraday rotator 6, and a mirror 7. In addition, as seen from a light incidence/emission end surface 2a of the optical fibre 2, the components of the birefringent element 3, the Faraday rotator 6, and the mirror 7 are disposed in the order of the birefringent element 3, the Faraday rotator 6, and the mirror 7; and the lens 4 is disposed between the birefringent element 3 and the Faraday rotator 6.

A polishing process is performed on the light incidence/emission end surface 2a of the optical fibre 2, and the light incidence/emission end surface 2a is disposed to face the one plane 3a of the birefringent element 3. Preferably, the light incidence/emission end surface 2a is formed to be inclined, and most preferably, the angle φ (that is, an angle with respect to the direction perpendicular to the axis direction of the core 2b) is set to be in a range of about 6 degrees to 8 degrees. In addition, preferably, a reflection protective film of a dielectric material is formed on the light incidence/emission end surface 2a. The optical fibre 2 is configured to include a core 2b and a clad 2c having a refractive index lower than that of the core 2b, which surrounds the core 2b. The optical fibre 2 is a single mode type optical fibre having an isotropic refractive index distribution. For example, a quartz-based optical fibre is used. As an example, the optical fibre 2 is optically connected to an optical fibre for a current sensor using the Faraday effect of the optical fibre. In this case, the optical fibre 2 emits the light beam propagated from the current sensor (not illustrated) or the like to the birefringent element 3; and the light beam reflected by the mirror 7 is incident on the optical fibre 2 and the optical fibre 2 propagates the reflected light beam to the current sensor (not illustrated) or the like again.

The birefringent element 3 is a uniaxial birefringent crystal. The crystal axis X31 is adjusted so as to be inclined by an angle α with respect to the Z axis direction of the plane 3a, and, as illustrated n FIG. 2, the crystal axis X32 on the optical plane (plane 3a) is arranged to be parallel to the y axis. As the birefringent element 3, for example, rutile ($TiO_2$), calcite ($CaCO_3$), yttrium.vanadate ($YVO_4$) crystals, lithium niobate ($LiNbO_3$), and the like may be used. Among these crystals, rutile which is particularly too hard to be injured and has no deliquescency is preferably used. In the case where rutile is used as the birefringent element 3, the angle α (corresponding to the direction of the crystal axis X31 in FIG. 1) between the normal line of the plane and the crystal axis is set to be 47.8 degrees. In addition, in order to allow the ordinary ray and the extraordinary ray after the birefringence to be emitted parallel to each other, the two planes 3a and 3b are set to be parallel to each other. In addition, preferably, a reflection protective film of a dielectric material is formed on the optical plane of the birefringent element 3. Next, the light beam propagates between the optical fibre 2 and the birefringent element 3.

On the other hand, the lens 4 is disposed to face the other plane 3b of the birefringent element 3. The lens 4 condenses the incident light beam. It is preferable that an aspherical lens, a ball lens, a plano-convex lens, a gradient index lens, or the like is used as the lens 4. In addition, for example, glass or plastic is used as a material of the lens 4.

The Faraday rotator 6 is an irreciprocal polarization plane rotation element which the light beam transmitting through the birefringent element 3 and the lens 4 is incident on and which rotates the polarization plane of the light beam. The Faraday rotator 6 is disposed in the vicinity of the magnet 5 and is applied with a magnetic field of the magnet 5 to rotate the polarization plane in proportion to the magnetic field strength. A single crystal having the Faraday effect, which has a Faraday rotation angle of 45 degrees when it is applied with the magnetic field of the magnet 5 and is magnetically saturated and which is as thin as possible, is used as the Faraday rotator 6. More specifically, a ferromagnetic bismuth substituted type garnet is most preferably used. The rotation direction of the polarization plane may be set to any one of the clockwise direction and the counterclockwise direction as seen in the z axis direction from the birefringent element 3. FIG. 2 illustrates an example of the counterclockwise direction. In addition, the Faraday rotator 6 is formed to have an outer shape of a flat. In the case where the Faraday rotator 6 is disposed, the other plane 3b of the birefringent element 3 and the one plane 6a of the Faraday rotator are opposite through the lens 4 interposed therebetween.

The magnet 5 is formed to have an outer shape of a ring and is disposed to surround the Faraday rotator 6. The magnet 5 applies a magnetic field to the Faraday rotator 6 to magnetically saturate the Faraday rotator 6. For example, a Sm—Co series or Nd—Fe—B series permanent magnet is used as the magnet 5.

The mirror 7 is a component which reflects the light beam condensed by the lens 4. A mirror formed by depositing a metal film on a surface of a substrate is used as the mirror 7. In addition, a mirror configured with a multi-layered dielectric film may also be used.

Figure 3:
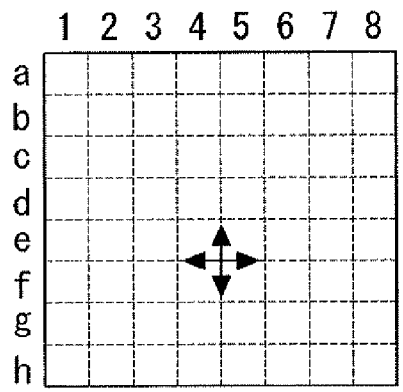
FIG. 3 is a diagram illustrating a polarization state of a light beam propagating the optical fibre birefringence compensation mirror of FIG. 1.
Figure 3:
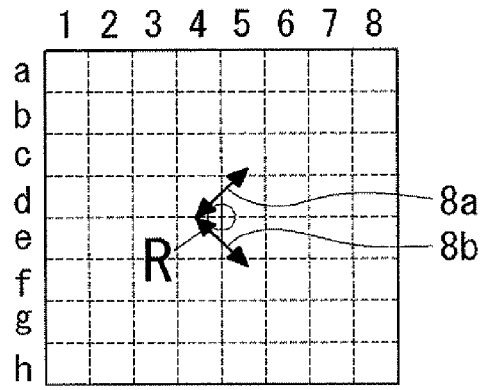
Figure 3:
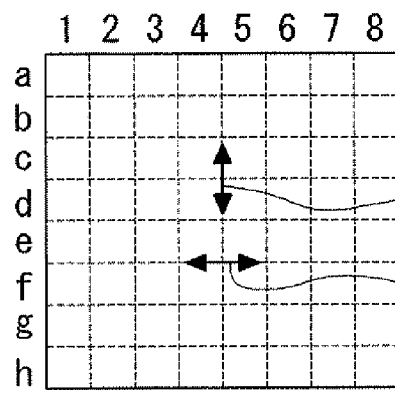
Figure 3:
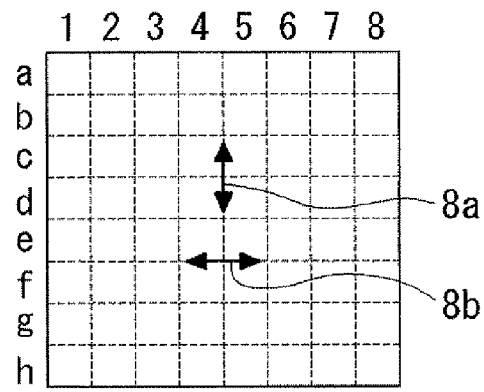
Figure 3:
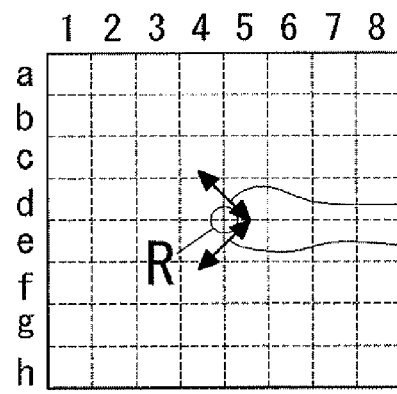
Figure 3:
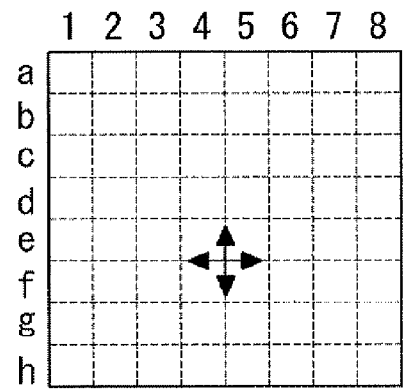

Next, operations of the optical fibre birefringence compensation mirror I will be described with reference to FIGS. 1 to 3. FIGS. 3(A) to 3(F) are diagrams illustrating polarization states of the light beam in the optical fibre birefringence compensation mirror 1 and correspond to the polarization states of the light beam on cross-sections of the optical path indicated by reference signs (A) to (F) in FIG. 1 respectively. In FIG. 3, the horizontal and vertical directions denote the x and y axes, respectively; and the direction oriented to the paper plane denotes the z axis. For the convenience of description, each cross-section of the optical path is divided by eight in the horizontal direction and eight in the vertical direction, and the propagation position of the polarized component of each cross-section of the optical path is expressed by 1 to 8 in the horizontal direction and by "a" to "h" in the vertical direction.

If the light beam from the current sensor or the like is propagated to the optical fibre 2, the light beam propagating through the optical fibre 2 is emitted from the light incidence/emission end surface 2a to the birefringent element 3 with a certain spreading angle, so that the light beam is incident on the birefringent element 3.

As illustrated in FIG. 3(A), the incidence position of the light beam incident from the optical fibre 2 on the birefringent element 3 is between 4 and 5 in the horizontal direction and between e and f in the vertical direction as seen in the matrix. In the embodiment, this position is denoted by (4-5, e-f). In addition, reference numeral R denotes a reflection point of each linearly polarized light beam on the mirror.

As illustrated in FIG. 3(B), the light beam incident on the birefringent element 3 is divided into the two linearly polarized light beams having perpendicular polarization directions, that is, the ordinary ray perpendicular to the crystal axis X32 and the extraordinary ray parallel to the crystal axis X32 by the birefringent element 3. The linearly polarized light beam 8b which is the extraordinary ray is shifted in the direction parallel to the crystal axis X32 disposed along the y axis direction, and the propagation position thereof at the time of being emitted from the birefringent element 3 is (4-5, c-d) in FIG. 3(B). On the other hand, since the linearly polarized light beam 8a is perpendicular to the direction of the crystal axis X32, the linearly polarized light beam 8a is not shifted within the birefringent element 3, and the linearly polarized light beam 8a transmits as the ordinary ray without a change in the propagation position. Therefore, the propagation position of the light beam emitted from the birefringent element 3 is (4-5, e-f) in FIG. 3(B). Herein, the thickness (crystal length) D of the birefringent element 3 in the propagation direction of the ordinary ray is expressed as follows.

$$D = \frac{(no^2 \cdot \tan^2\theta + ne^2) \cdot dc}{(no^2 - ne^2)\tan\theta} \qquad [\text{Equation 1}]$$

Herein, no denotes a refractive index of the ordinary ray in the birefringent element 3; ne denotes a refractive index of the extraordinary ray in the birefringent element 3; θ denotes an angle between the crystal axis X31 of the birefringent element 3 and the plane perpendicular to the propagation direction of the ordinary ray; and dc denotes a division width of the ordinary ray and the extraordinary ray.

As described above, in the case where the thickness D is set, although no and ne of each crystal are changed, the optimal thickness can be set according to the change, and the divided light beams can be emitted from the plane 3b. In addition, if the direction of the crystal axis X31 is adjusted, the thickness D can be reduced. In addition, in the case where no, ne, and dc are constant and the birefringent element 3 is rutile, theoretically, when α is 47.8 degrees, the thickness D can be suppressed down to the minimum and the division width of the ordinary ray and the extraordinary ray can be maintained to the maximum. Therefore, most preferably, α is 47.8 degrees.

Preferably, the shift amount of the extraordinary ray in the birefringent element 3 is set to be equal to or larger than twice the mode field diameter of the optical fibre 2. The reason is as follows. Although the Faraday rotation angles of the two linearly polarized light beams, in which the Faraday rotation occurs in the reciprocation the Faraday rotator 6, are shifted from 90 degrees since the Faraday rotator 6 has the temperature characteristic and the wavelength characteristic, the linearly polarized light beams having the component shifted from 90 degrees divided by the birefringent element 3 can be prevented from being incident on the optical fibre 2.

Next, the two linearly polarized light beams 8a and 8b emitted from the birefringent element 3 is incident on the lens 4 in parallel to the optical axis X4 of the lens 4 to be condensed. During the condensing, the polarization state is not changed.

The two linearly polarized light beams 8a and 8b condensed by the lens 4 are further incident on the Faraday rotator 6. As described above, since the Faraday rotator 6 is applied with a magnetic field of the magnet 5, and the Faraday rotator 6 is set so as to be saturated to have a Faraday rotation angle of 45 degrees. Therefore, each of the polarization planes of the two linearly polarized light beams 8a and 8b emitted from the lens 4 transmits through the Faraday rotator 6, so that the polarization planes are rotated by 45 degrees in the same direction, as illustrated in FIG. 3(c).

As illustrated in FIGS. 1, 3(C), and 3(D), the two linearly polarized light beams 8a and 8b transmitting through the Faraday rotator 6 are reflected in point symmetry at one point R on the surface of the mirror 7 at the side opposite to the incidence angle, so that the up and down positions before and after the reflection are exchanged. As understood from FIG. 1, in the optical fibre birefringence compensation mirror 1, the mirror 7 and the lens 4 are disposed to be aligned so that the reflection point (the above-described one point R) on the mirror 7 and the optical axis X4 of the lens 4 are located in the same straight line in the propagation direction (z axis direction) of the light beam. In addition, the alignment of the lens 4 is performed so that the central positions of the two linearly polarized light beams 8a and 8b are separated by an equal distance from the optical axis X4 of the lens 4.

The two reflected linearly polarized light beams 8a and 8b transmit through the Faraday rotator 6 again, so that each of the polarization directions of the two linearly polarized light beams 8a and 8b is further rotated by 45 degrees in the same direction (refer to FIG. 3(E)). Therefore, it can be understood that the polarization planes of the two linearly polarized light beams 8a and 8b transmitting through the Faraday rotator 6 after the reflection by the mirror 7 are rotated by 90 degrees with respect to the polarization planes before the incidence on the Faraday rotator 6 illustrated in FIG. 3(B). When the linearly polarized light beams are incident on the birefringent element 3 again, the one linearly polarized light beam 8a becomes the extraordinary ray in the inner portion of the birefringent element 3, and the other linearly polarized light beam 8b becomes the ordinary ray in the inner portion of the birefringent element 3.

The two linearly polarized light beams 8a and 8b emitted from the Faraday rotator 6 transmit through the lens 4 again to be emitted to positions which are symmetric with respect to the optical axis X4 of the lens 4. Next, the light beams are emitted from the lens 4 so that the axes of the light beam are parallel to the z axis.

Next, the two linearly polarized light beams 8a and 8b are incident on the birefringent element 3 again. As described above, the two linearly polarized light beams 8a and 8b become the ordinary ray and the extraordinary ray within the birefringent element 3, and as illustrated in FIG. 3(F), only the extraordinary ray is shifted, so that the two linearly polarized light beams 8a and 8b are re-combined as one light beam. When the two linearly polarized light beams 8a and 8b are incident on the birefringent element 3 to re-transmit through the birefringent element 3, the linearly polarized light beam 8a transmitting as the ordinary ray when the light beam first transmits through the birefringent element 3 transmits through the birefringent element 3 as the extraordinary ray during the re-transmission. On the other hand, the linearly polarized light beam 8b transmitting as the extraordinary ray when the light beam first transmits through the birefringent element 3 transmits through the birefringent element 3 as the ordinary ray during the re-transmission, so that the two linearly polarized light beams 8a and 8b are re-combined as one light beam.

The re-combined light beam is emitted from the one plane 3a of the birefringent element 3, is incident on the core 2b of the optical fibre 2, is propagated through the optical fibre 2, and is propagated through the optical fibre for sensor such as a current sensor again.

In this manner, according to the optical fibre birefringence compensation mirror 1 of the embodiment, the optical path is configured so that the light beam emitted from the optical fibre 2 is divided into the two linearly polarized light beams 8a and 8b and the two perpendicular linearly polarized light beams 8a and 8b are reflected in point symmetry. In other words, during the point-symmetric reflection by the mirror 7, since the polarization directions of the two linearly polarized light beams 8a and 8b are perpendicular to each other, the interference is solved, so that occurrence of a plurality of coupling peak positions can be prevented. Therefore, it is possible to easily find the optimal coupling positions, so that it is possible to easily perform an alignment assembling process.

In addition, when the two linearly polarized light beams 8a and 8b transmit through the birefringent element 3 twice in the reciprocal path, the ordinary ray and the extraordinary ray are exchanged through the reflection by the mirror 7 and the 90-degrees rotation of the polarization plane by the Faraday rotator 6, so that with respect to an arbitrary polarized light beam emitted from the optical fibre 2, the polarized light beam located at an antipodal point on the Poincare sphere is incident on the optical fibre 2. Therefore, the birefringence occurring due to the optical fibre 2 can be compensated for.

In addition, the optical fibre birefringence compensation mirror 1 uses the Faraday rotator 6. Even if the Faraday rotator 6 has the temperature characteristic and the wavelength characteristic, since the perpendicularity of the polarization planes of the two linearly polarized light beams 8a and 8b are preserved, the birefringence occurring due to the optical fibre 2 is compensated for.

Since the optical fibre birefringence compensation mirror 1 according to the embodiment has the effect, if the optical fibre birefringence compensation mirror 1 is optically connected to the current sensor or the like, the birefringence due to the optical fibre 2 is compensated for. Therefore, a change in measurement result due to vibration caused by photoelasticity of the optical fibre for sensors is suppressed, and vibration resistance is improved.

In addition, since it has excellent vibration resistance, a quartz-based optical fibre having birefringence higher than that of an optical fibre containing lead oxide can be used for the optical fibre for sensors, so that it is possible to form a current sensor which can detect a large-magnitude current.

Figure 20:
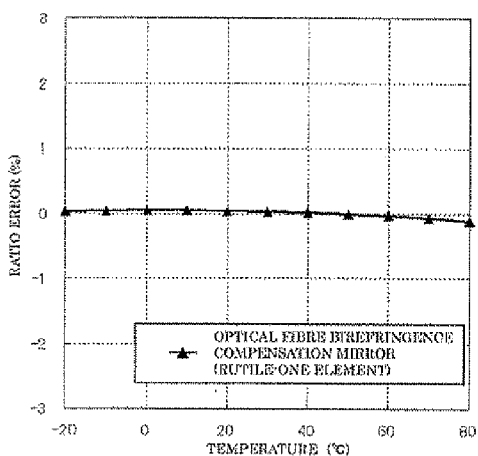
FIG. 20 is a graph illustrating a ratio error-temperature characteristic in a measured value of a to-be-measured current output from a current sensor connected to an optical fibre birefringence compensation mirror illustrated in FIG. 1.

FIG. 20 illustrates temperature dependency of the measured value of the to-be-measured current output from the current sensor connected to the optical fibre birefringence compensation mirror 1 by using a ratio error-temperature characteristic. In addition, the ratio error in FIG. 20 denotes a ratio error in the measured value of the to-be-measured current output from the current sensor when the optical fibre birefringence compensation mirror 1 is connected to the current sensor and the temperature of the optical fibre birefringence compensation mirror 1 is changed from −20° C. to 80° C. It can be seen from FIG. 20 that, due to the connection of the optical fibre birefringence compensation mirror 1, the temperature dependency of the current sensor is suppressed to a degree that it may not almost exist in a temperature range of −20° C. to 80° C., and a change in the ratio error does not almost exist. Therefore, it can be understood that a change in the measured value of the to-be-measured current of the current sensor is suppressed.

<Second Embodiment>

Next, an optical fibre birefringence compensation mirror according to a second embodiment of the invention will be described in detail with reference to FIGS. 4 and 5. In the figures, x axes, y axes, and z axes are in one-to-one correspondence. In addition, the same elements as those of the first embodiment are denoted by the same reference numerals, and redundant description thereof will not be repeated or will be simplified.

Figure 4:
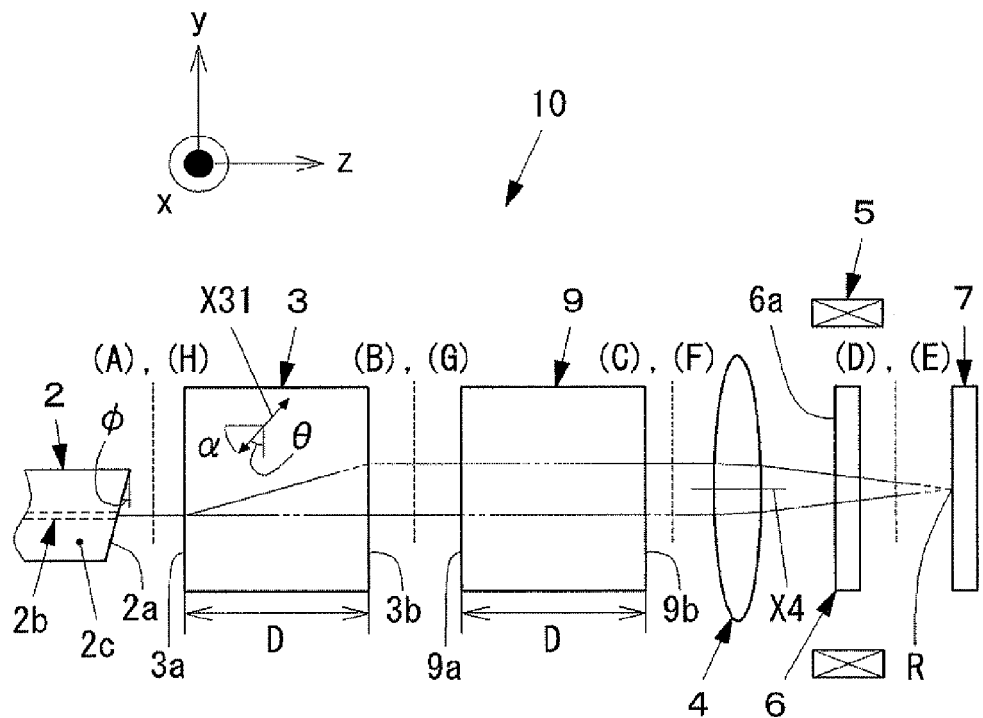
FIG. 4 is a diagram illustrating a configuration of an optical fibre birefringence compensation mirror according to a second embodiment of the present invention.
Figure 5:
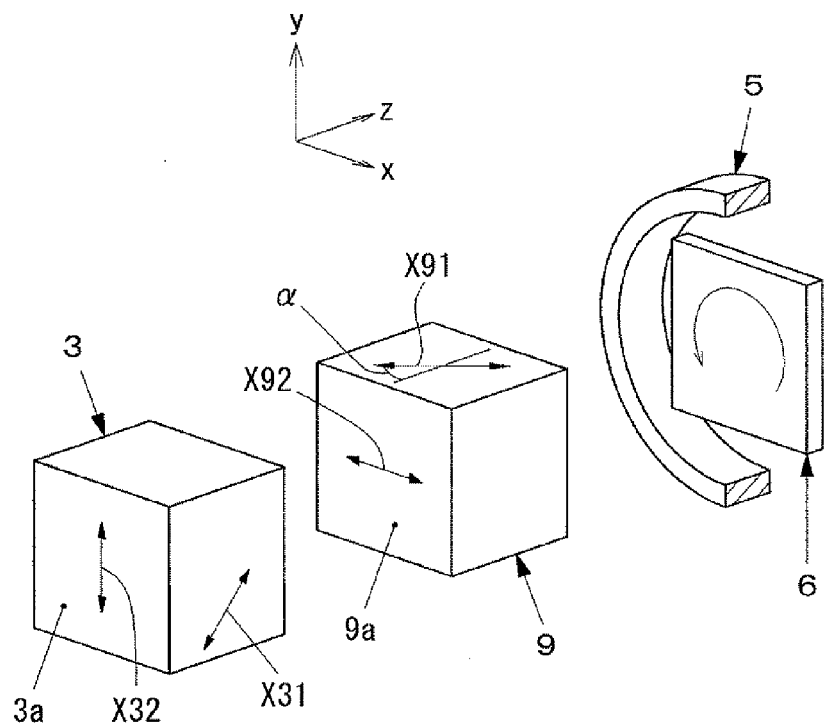
FIG. 5 is a perspective view illustrating arrangement of a first birefringent element, a second birefringent element, a Faraday rotator, and a magnet of the optical fibre birefringence compensation mirror of FIG. 4.

In FIG. 4, an optical fibre birefringence compensation mirror 10 according to the second embodiment of the present invention is different from the optical fibre birefringence compensation mirror 1 in that a second birefringent element 9 is installed in the optical path of between the birefringent element 3 and the lens 4. The second birefringent element 9 has two planes 9a and 9b parallel to each other. Hereinafter, for the convenience of description, the birefringent element 3 is referred to as a "first birefringent element 3". In addition, as seen from the light incidence/emission end surface 2a of the optical fibre 2, the components of the first birefringent element 3, the second birefringent element 9, the Faraday rotator 6, and the mirror 7 are disposed in the order of the first birefringent element 3, the second birefringent element 9, the Faraday rotator 6, and the mirror 7; and the lens 4 is disposed between the birefringent element 3 and the Faraday rotator 6.

Similarly to the first birefringent element 3, the second birefringent element 9 is also a uniaxial birefringent element body, where a crystal axis X91 is adjusted so as to be tilted by an angle α, with respect to the z axis direction and a crystal axis X92 is arranged to be parallel to the x axis on an optical plane (plane 9a). Therefore, as seen from the optical fibre 2, the direction of the crystal axis X92 of the second birefringent element 9 is set to be different by 90 degrees from the direction of the crystal axis X32 of the first birefringent element 3. When the second birefringent element 9 is arranged with respect to the first birefringent element 3, the other plane 3b of the first birefringent element 3 and the one plane 9a of the second birefringent element are allowed to face each other. On the other hand, a lens 4 is arranged to face the other plane 9b of the second birefringent element 9.

As the second birefringent element 9, rutile ($TiO_2$), calcite ($CaCO_3$), yttrium vanadate ($YVO_4$) crystals, lithium niobate ($LiNbO_3$), and the like may be used. Among these crystals, rutile which is particularly too hard to be injured and has no deliquescency is preferably used. In the case where rutile is used as the second birefringent element 9, the angle α (corresponding to the direction of the crystal axis X91 in FIG. 5) between the normal line of the plane and the crystal axis is set to be 47.8 degrees. In addition, in order to allow the ordinary ray and the extraordinary ray after the birefringence to be emitted parallel to each other, the two planes 9a and 9b are set to be parallel to each other. In addition, preferably, a reflection protective film of a dielectric material is formed on the optical plane of the second birefringent element 9.

Figure 6:
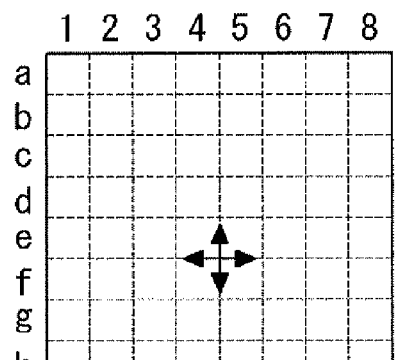
FIG. 6 is a diagram illustrating a polarization state of a light beam in the optical fibre birefringence compensation mirror of FIG. 4 from the time when the light beam is emitted from an optical fibre to the time when the light beam is reflected by the mirror.
Figure 6:
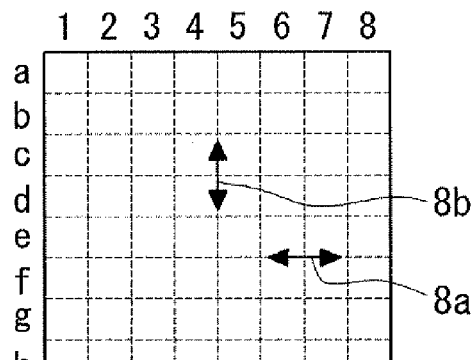
Figure 6:
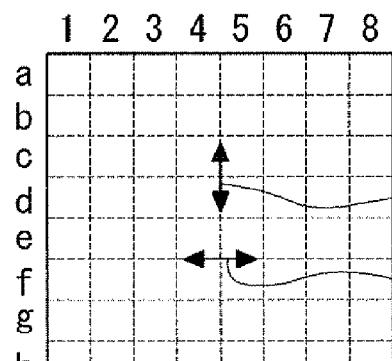
Figure 6:
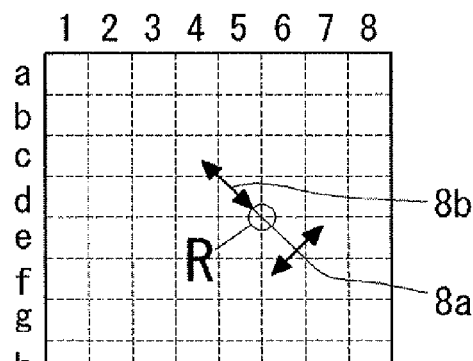
Figure 7:
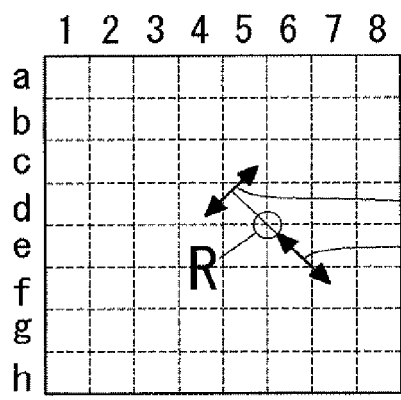
FIG. 7 is a diagram illustrating a polarization state of the light beam in the optical fibre birefringence compensation mirror of FIG. 4 from the time when the light beam is reflected by the mirror to the time when the light beam is incident on an optical fibre.
Figure 7:
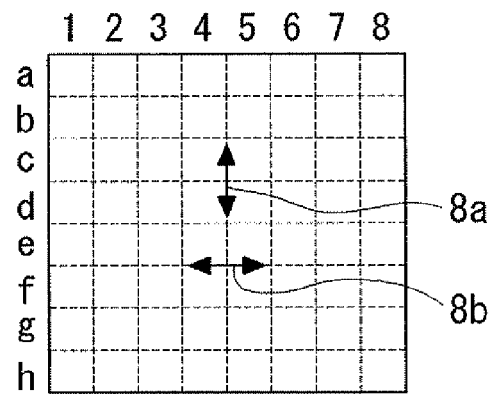
Figure 7:
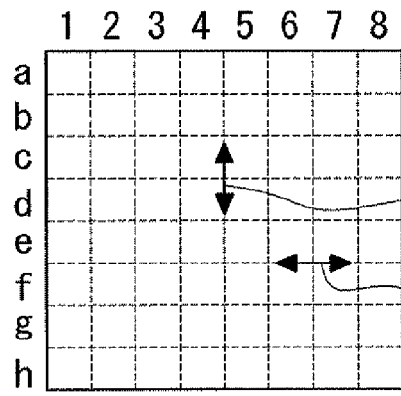
Figure 7:
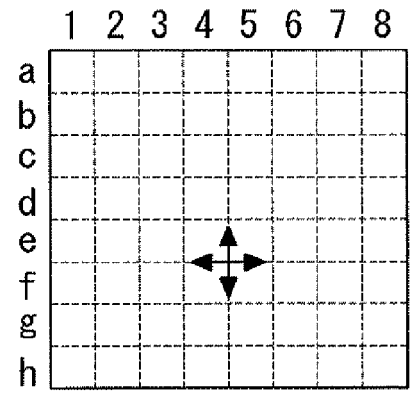

Next, operations of the optical fibre birefringence compensation mirror 10 will be described with reference to FIGS. 4, 6, and 7. FIGS. 6(A) to 6(D) are diagrams illustrating polarization states of the light beam from the time of being emitted from the optical fibre 2 to the time of being reflected by the mirror 7 in the optical fibre birefringence compensation mirror 10 and correspond to the polarization states of the light beam on cross-sections of the optical path indicated by reference signs (A) to (D) in FIG. 4 respectively. In addition, FIGS. 7(E) to 7(H) are diagrams illustrating polarization states of the light beam from time of being reflected by the mirror 7 to the time of being incident on the optical fibre 2 in the optical fibre birefringence compensation mirror 10 and correspond to the polarization states of the light beam on cross-sections of the optical path indicated by reference signs (E) to (H) in FIG. 4 respectively. In FIGS. 6 and 7, the horizontal and vertical directions denote the x and y axes, respectively; and the direction oriented to the paper plane denotes the z axis. For the convenience of description, each cross-section of the optical path is divided by eight in the horizontal direction and eight in the vertical direction, and the propagation position of the polarized component of each cross-section of the optical path is expressed by 1 to 8 in the horizontal direction and by "a" to "h" in the vertical direction.

Similarly to the first embodiment, for example, if the light beam from the current sensor or the like is propagated to the optical fibre 2, the light beam propagating through the optical fibre 2 is emitted from the light incidence/emission end surface 2a to the birefringent element 3 with a certain spreading angle, so that the light beam is incident on the first birefringent element 3. As illustrated in FIG. 6(A), the incidence position of the light beam incident from the optical fibre 2 on the first birefringent element 3 is between 4 and 5 in the horizontal direction and between e and f in the vertical direction as seen in the matrix. In the embodiment, this position is denoted by (4-5, e-f).

The light beam incident on the first birefringent element 3 is divided in the direction of the crystal axis X32 disposed along the y axis direction, and as illustrated in FIG. 6(B), the light beam is divided into the two linearly polarized light beams 8a and 8b having perpendicular polarization directions, that is, the ordinary ray and the extraordinary ray.

The divided two linearly polarized light beams 8a and 8b are emitted from the other plane 3b of the first birefringent element 3 and, subsequently, are incident on the second birefringent element 9. As described above, the direction of the crystal axis X92 is set to be different by 90 degrees from the direction of the crystal axis X32. Therefore, the polarization plane of the linearly polarized light beam 8a which is the ordinary ray in the first birefringent element 3 is parallel to the direction of the crystal axis X92. Therefore, since the linearly polarized light beam 8a which transmits through the first birefringent element 3 as the ordinary ray becomes the extraordinary ray in the second birefringent element 9, the linearly polarized light beam 8a is shifted in the horizontal direction and transmits through the second birefringent element 9 as illustrated in FIG. 6(C). On the other hand, since the polarization plane of the linearly polarized light beam 8b which transmits through the first birefringent element 3 as the extraordinary ray becomes perpendicular to the crystal axis X92, linearly polarized light beam 8b goes straight to transmit through the second birefringent element 9 as the ordinary ray without shifting.

In this manner, the direction of the crystal axis X32, the direction of the crystal axis X92, the thickness D of the first birefringent element 3, and the thickness D of the second birefringent element 9 are set so that the two divided linearly polarized light beams 8a and 8b necessarily have the polarization states of both of the ordinary ray and the extraordinary ray when the two divided linearly polarized light beams 8a and 8b transmit through the first birefringent element 3 and the second birefringent element 9, Preferably, a sum of the shift amount of the extraordinary ray in the first birefringent element 3 and the shift amount of the extraordinary ray in the second birefringent element 9 is set to be equal to or larger than twice the mode field diameter of the optical fibre 2. The reason is as follows. Although the Faraday rotation angles of the two linearly polarized light beams, in which the Faraday rotation occurs in the reciprocation the Faraday rotator 6, are shifted from 90 degrees since the Faraday rotator 6 has the temperature characteristic and the wavelength characteristic, the linearly polarized light beams having the component shifted from 90 degrees divided by the second birefringent element 9 and the first birefringent element 3 can be prevented from being incident on the optical fibre 2.

Herein, in the propagation direction of the ordinary ray, the thickness (crystal length) D of the second birefringent element 9 is set to be the same as the thickness D of the first birefringent element 3.

$$D = \frac{(no^2 \cdot \tan^2\theta + ne^2) \cdot dc}{(no^2 - ne^2)\tan\theta}$$ [Equation 2]

The optical system of the optical fibre birefringence compensation mirror 10 is configured so that the shift amount of the extraordinary ray at the time of transmitting the first birefringent element 3 and the shift amount of the extraordinary ray at the time of transmitting the second birefringent element 9 are the same. Therefore, as described above, it is preferable that the thickness values of the two birefringent elements 3 and 9 are set to the same value D and the two birefringent elements 3 and 9 are configured by using the same material.

In addition, it is more preferably that the optical path length difference between the two linearly polarized light beams generated through the division of the ordinary ray and the extraordinary ray at the time of transmitting the second birefringent element 9 is set to be the same as the optical path length difference between the two linearly polarized light beams generated through the division of the ordinary ray and the extraordinary ray at the time of transmitting the first birefringent element 3. As a method for equalizing the optical path length differences, the thickness of second birefringent element 9 and the direction of the crystal axis X91 are set according to the thickness of the first birefringent element 3 and the direction of the crystal axis X31. In the simplest configuration, as described above, the thickness of the two birefringent elements 3 and 9 are set to the same value D; the same material where the directions of the crystal axes X31 and X91 are aligned is used; and the direction of the crystal axis X92 is set to be different by 90 degrees from the direction of the crystal axis X32. According to this configuration, the optical path length difference between the two linearly polarized light beams 8a and 8b generated through the division of the first birefringent element 3 can be more securely compensated for by the second birefringent element 9.

Next, the two linearly polarized light beams 8a and 8b emitted from the second birefringent element 9 are incident on the lens 4 parallel to the optical axis X4 of the lens 4 to be condensed, and the two linearly polarized light beams are incident on the Faraday rotator 6 to transmits through the Faraday rotator 6, so that the polarization planes are rotated by 45 degrees in the same direction, as illustrated in FIG. 6(D).

As illustrated in FIGS. 4, 6(D), and 7(E), the two linearly polarized light beams 8a and 8b transmitting through the Faraday rotator 6 are reflected in point symmetry at one point R on the surface of the mirror 7 at the side opposite to the incidence angle, so that the propagation positions before and after the reflection are exchanged. As understood from FIG. 4, in the optical fibre birefringence compensation mirror 10, the mirror 7 and the lens 4 are disposed to be aligned so that the reflection point (the above-described one point R) on the mirror 7 and the optical axis X4 of the lens 4 are located in the same straight line in the propagation direction (z axis direction) of the light beam. In addition, the alignment of the lens 4 is performed so that the central positions of the two linearly polarized light beams 8a and 8b are separated by an equal distance from the optical axis X4 of the lens 4. In addition, it can be understood that, as the reflection point R of the optical fibre birefringence compensation mirror 1 and the reflection point R of the optical fibre birefringence compensation mirror 10 according to the embodiment are seen in the z axis direction, the positions thereof are not coincident with each other, but the reflection point R of the optical fibre birefringence compensation mirror 10 is shifted in the x axis direction. This is because, in the optical fibre birefringence compensation mirror 10, the second birefringent element 9 is added, so that the linearly polarized light beam 8a is shifted in the x axis direction.

In the optical fibre birefringence compensation mirror 10, before the two linearly polarized light beams 8a and 8b are incident on the lens 4, the two linearly polarized light beams 8a and 8b are shifted by the equal distance due to the two birefringent elements 3 and 9. Therefore, the optical path length difference between the two linearly polarized light beams 8a and 8b generated through the division of the first birefringent element 3 is solved before the two linearly polarized light beams 8a and 8b are incident on the lens 4.

The two reflected linearly polarized light beams 8a and 8b transmit through the Faraday rotator 6 again, so that each of the polarization directions of the two linearly polarized light beams 8a and 8b is further rotated by 45 degrees in the same direction (refer to FIG. 7(F)). Therefore, it can be understood that the polarization planes of the two linearly polarized light beams 8a and 8b transmitting through the Faraday rotator 6 after the reflection by the mirror 7 are rotated by 90 degrees with respect to the polarization planes before the incidence on the Faraday rotator 6 illustrated in FIG. 6(C).

The two linearly polarized light beams 8a and 8b emitted from the Faraday rotator 6 transmit through the lens 4 again to be emitted to the positions which are symmetric with respect to the optical axis X4 of the lens 4. Next, the light beams are emitted from the lens 4 so that the axes of the light beams are parallel to the z axis.

Next, the two linearly polarized light beams 8a and 8b are incident on the second birefringent element 9 again. As described above, since the polarization planes of the two linearly polarized light beams 8a and 8b transmitting through the Faraday rotator 6 after the reflection by the mirror 7 are rotated by 90 degrees with respect to the polarization plane before the incidence on the Faraday rotator 6 illustrated in FIG. 6(C), the linearly polarized light beam 8a is formed so that the polarization direction of the linearly polarized light beam 8a is perpendicular to the direction of the crystal axis X92, and the linearly polarized light beam 8b is formed so that the polarization direction of the one linearly polarized light beam 8b is parallel to the direction of the crystal axis X92. Therefore, in the inner portion of the second birefringent element 9, the linearly polarized light beam 8b becomes the extraordinary ray and is shifted in the horizontal direction as illustrated in FIGS. 7(F) and 7(G). On the other hand, in the inner portion of the second birefringent element 9, the linearly polarized light beam 8a becomes the ordinary ray and is not shifted but goes straight as the ordinary ray.

Next, the two linearly polarized light beams 8a and 8b are incident from the plane 3b on the first birefringent element 3 again. The polarization plane of the linearly polarized light beam 8a which is the ordinary ray in the second birefringent element 9 is parallel to the direction of the crystal axis X32. Therefore, since the linearly polarized light beam 8a which transmits through the second birefringent element 9 as the ordinary ray becomes the extraordinary ray in the first birefringent element 3, the linearly polarized light beam 8a is shifted in the y axis direction (refer to FIGS. 7(G) and 7(H)). On the other hand, since the polarization plane of the linearly polarized light beam 8b which transmits through the second birefringent element 9 as the extraordinary ray becomes perpendicular to the crystal axis X92, the linearly polarized light beam 8b goes straight to transmit through the first birefringent element 3 as the ordinary ray without shifting. In this manner, as illustrated in FIG. 7(H), the two linearly polarized light beams 8a and 8b is re-combined as one light beam.

The re-combined light beam is emitted from the one plane 3a of the first birefringent element 3, is incident on the core 2b of the optical fibre 2, propagates the optical fibre 2, and propagates the optical fibres for sensors such as a current sensor again.

In this manner, according to the optical fibre birefringence compensation mirror 10 of the embodiment, the optical path is configured so that the light beam emitted from the optical fibre 2 is divided into the two perpendicular linearly polarized light beams 8a and 8b and the two perpendicular linearly polarized light beams 8a and 8b are reflected in point symmetry. In other words, during the point-symmetric reflection by the mirror 7, since the polarization directions of the two linearly polarized light beams 8a and 8b are perpendicular to the polarization directions the interference is solved, so that occurrence of a plurality of coupling peak positions can be prevented. Therefore, it is possible to easily find the optimal coupling positions, so that it is possible to easily perform an alignment assembling process.

In addition, in the optical fibre birefringence compensation mirror 10, the two linearly polarized light beams 8a and 8b are shifted by the same distance by the two birefringent elements 3 and 9. Therefore, the optical path length difference between the two linearly polarized light beams 8a and 8b generated through the division of the first birefringent element 3 is compensated for by the second birefringent element 9, so that the optical path length difference is solved before the two linearly polarized light beams 8a and 8b are incident on the lens 4. Therefore, deterioration in coupling efficiency caused by focus shifting of a lens is prevented. In addition, since the optical path is configured so that, after the optical path length difference is compensated for, the ordinary ray and the extraordinary ray are exchanged through the reflection by the mirror 7 and the 90-degree rotation of the polarization plane by the Faraday rotator 6, with respect to an arbitrary polarized light beam emitted from the optical fibre 2, the polarized light beam located at an antipodal point on the Poincare sphere is incident on the optical fibre 2. Therefore, the birefringence occurring due to the optical fibre 2 can be compensated for.

In addition, although the optical fibre birefringence compensation mirror 10 uses the Faraday rotator 6 and the Faraday rotator 6 has the temperature characteristic and the wavelength characteristic, since the perpendicularity of the polarization planes of the two linearly polarized light beams 8a and 8b is preserved, the birefringence occurring due to the optical fibre 2 is compensated for.

Since the optical fibre birefringence compensation mirror 10 according to the embodiment has the effect, if the optical fibre birefringence compensation mirror 10 is optically connected to the current sensor or the like, the birefringence due to the optical fibre 2 is compensated for. Therefore, a change in measurement result due to vibration caused by photoelasticity of the optical fibre for sensors is suppressed, so that vibration resistance is improved.

In addition, since it has excellent vibration resistance, a quartz-based optical fibre having birefringence higher than that of an optical fibre containing lead oxide can be used for the optical fibre for sensors, so that it is possible to form a current sensor which can detect a large-magnitude current.

Figure 21:
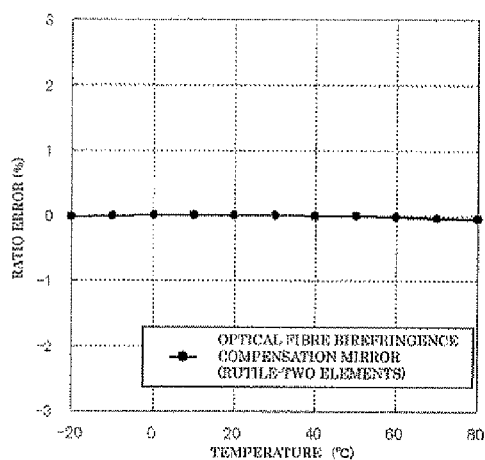
FIG. 21 is a graph illustrating a ratio error-temperature characteristic in a measured value of a to-be-measured current output from a current sensor connected to an optical fibre birefringence compensation mirror illustrated in FIG. 4.

FIG. 21 illustrates temperature dependency of the measured value of the to-be-measured current output from the current sensor connected to the optical fibre birefringence compensation mirror 10 by using a ratio error-temperature characteristic. In addition, the ratio error in FIG. 21 denotes a ratio error in the measured value of the to-be-measured current output from the current sensor when the optical fibre birefringence compensation mirror 10 is connected to the current sensor and the temperature of the optical fibre birefringence compensation mirror 10 is changed from −20° C. to 80° C. It can be seen from FIG. 21 that, due to the connection of the optical fibre birefringence compensation mirror 10, the temperature dependency of the current sensor is further improved in comparison with the first embodiment and the temperature dependency is suppressed to a degree that it may not almost exist in a temperature range of −20° C. to 80° C., and a change in the ratio error does not almost exist. Therefore, it can be understood that a change in the measured value of the to-be-measured current of the current sensor is suppressed.

In addition, the optical fibre birefringence compensation mirror 1 or 10 according to the present invention can be modified in various forms based on the technical idea of the present invention. For example, an optical fibre containing lead oxide may be used as the optical fibre 2.

In addition, the directions of the crystal axes X32 and X92 are not limited to those of the embodiment, but the directions may be arbitrarily set. In addition, the lens 4 may be disposed between the Faraday rotator 6 and the mirror 7.

Figure 15:
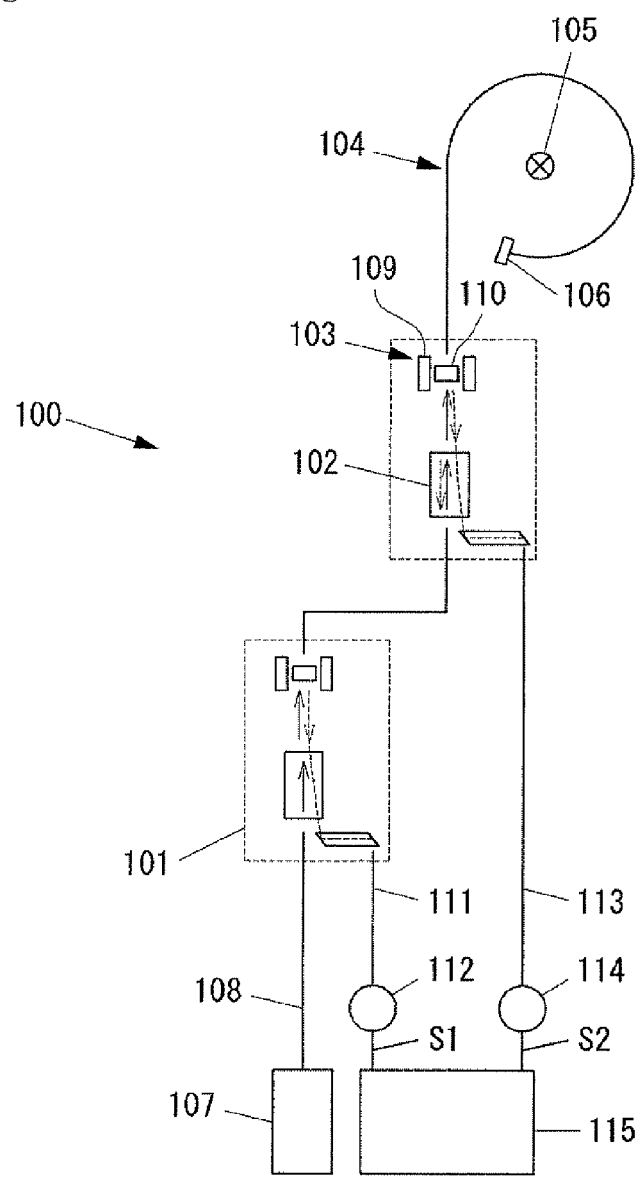
FIG. 15 is a schematic diagram illustrating an example of a current sensor using an optical fibre in the related art.
Figure 16:
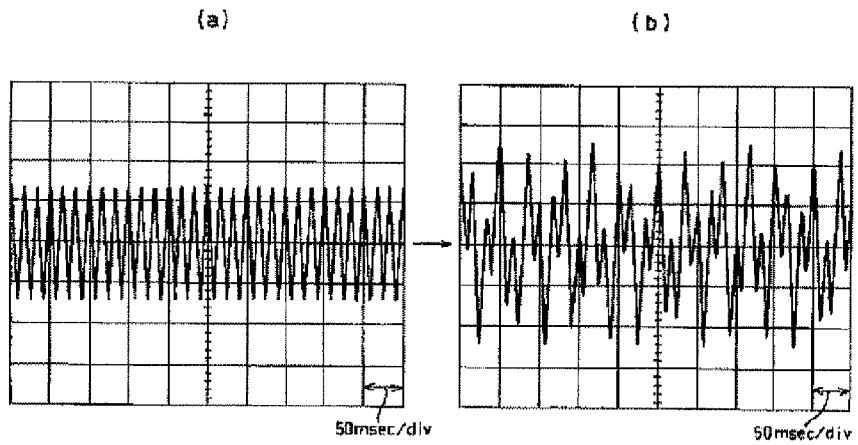
FIG. 16 is a diagram illustrating a waveform in an example of a change in a measurement result of a current sensor by a breaker in GIS.
Figure 17:
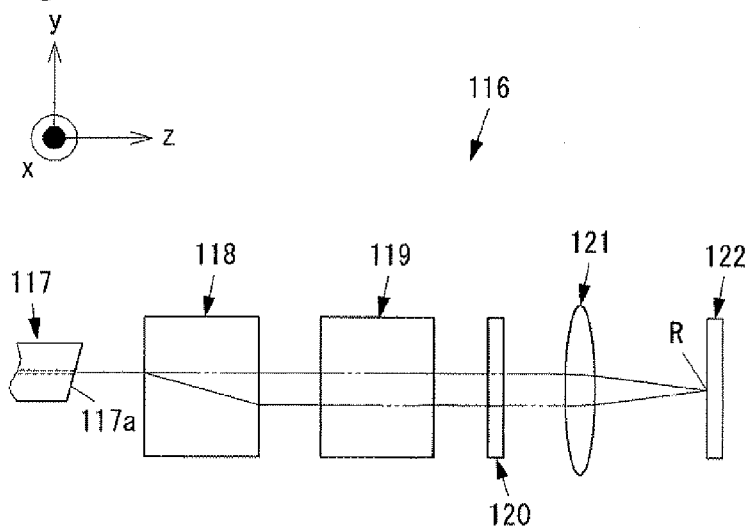
FIG. 17 is a schematic diagram illustrating an example of a polarization plane rotation mirror in the related art.
Figure 18:
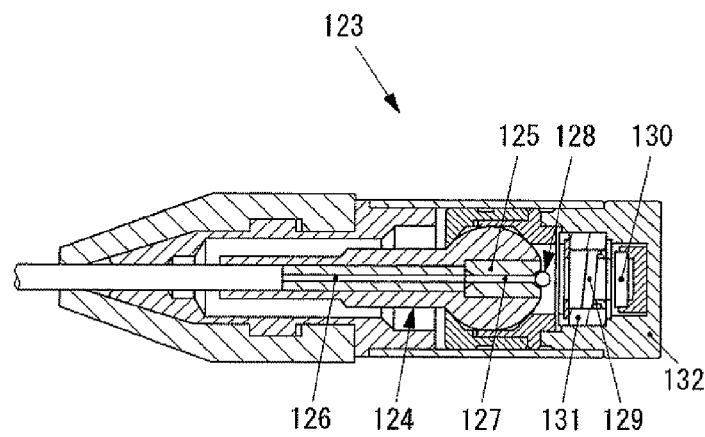
FIG. 18 is a cross-sectional view illustrating an example of a Faraday mirror in the related art.
Figure 19:
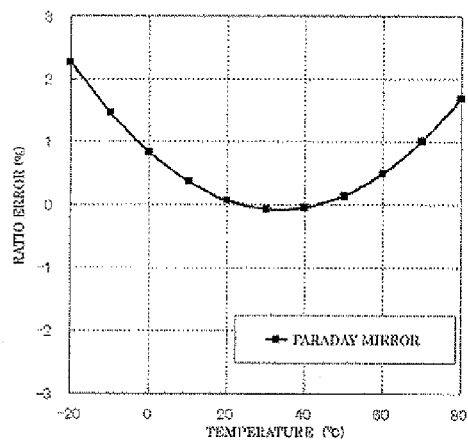
FIG. 19 is a graph illustrating a ratio error-temperature characteristic in a measured value of a to-be-measured current output from a current sensor connected to a Faraday mirror illustrated in FIG. 18.

In addition, as a current sensor using the Faraday effect of an optical fibre, the current sensor where the optical fibre 104 for sensors is disposed to surround the conductor 105 flowing the to-be-measured current as illustrated in FIG. 15 is preferred. However, the present invention is not limited thereto.

EXAMPLES

Next, although Examples of the present invention are described, the present invention is not limited to Examples 1 to 3. Hereinafter, as samples of Examples 1 to 3, an optical fibre birefringence compensation mirror 1 and an optical fibre birefringence compensation mirror 10 are provided; and as samples of Comparative Example, a Faraday mirror 11 and a mirror 7 are provided in FIGS. 8(a) and 8(b), respectively. In addition, in the optical fibre birefringence compensation mirror 1 and the optical fibre birefringence compensation mirror 10, the same elements are denoted by the same reference numerals, and redundant description thereof is not repeated or is simplified.

Figure 8:
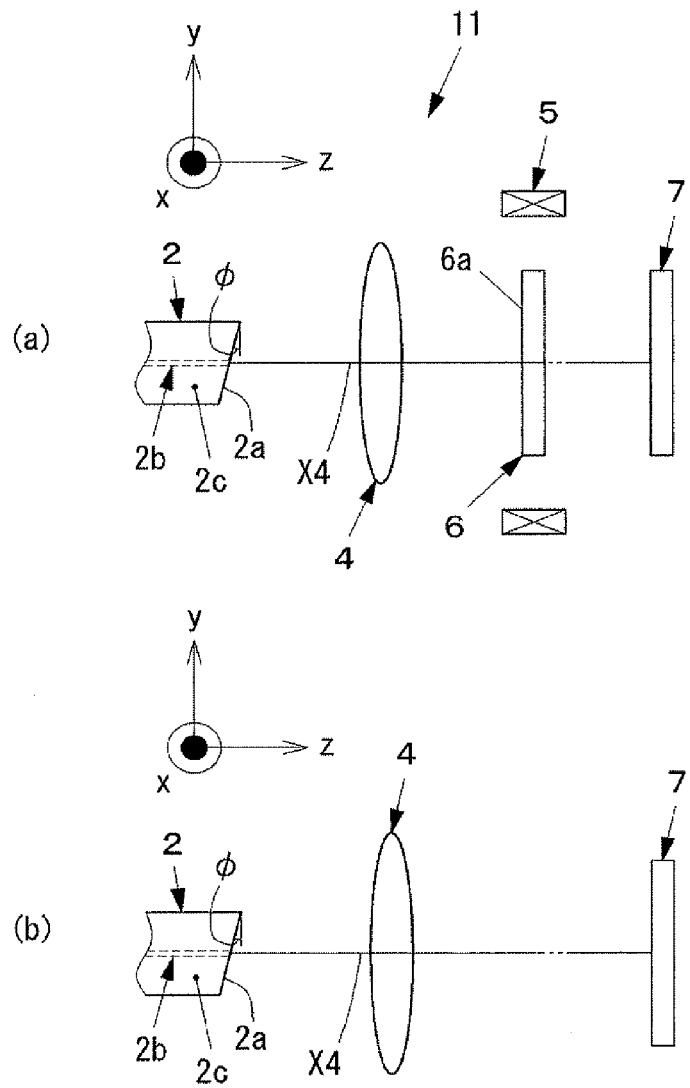
FIG. 8 is a diagram illustrating a configuration of Faraday mirrors and mirrors according to Examples 1 to 3.

The Faraday mirror 11 of FIG. 8(a) is an optical unit having a configuration where the birefringent element 3 is removed from the optical fibre birefringence compensation mirror 1, and FIG. 8(b) illustrates a configuration where only the mirror 7 is disposed to face the light incidence/emission end surface 2a of the optical fibre 2.

Example 1

Figure 9:
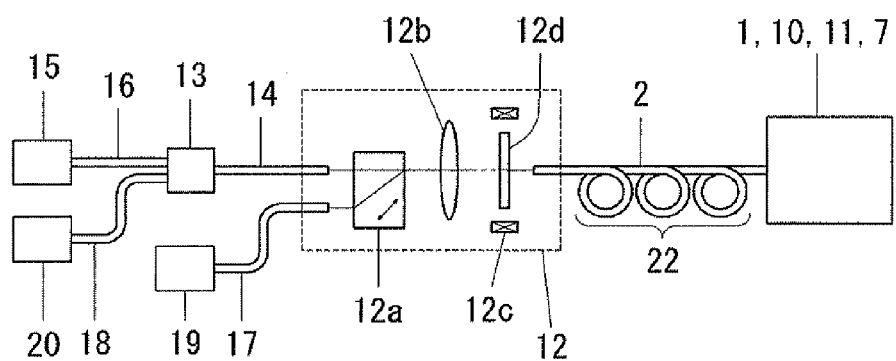
FIG. 9 is a diagram illustrating a configuration of an optical system according to Example 1.

The optical fibres 2 for the optical fibre birefringence compensation mirror 1, the optical fibre birefringence compensation mirror 10, the Faraday mirror 11, and the mirror 7 are uniformly adopted, or used in a single mode type quartz-based optical fibre, and the components are optically connected to an optical bias module 12 through the optical fibre 2 illustrated in FIG. 9. In addition, a polarization depending type optical circulator 13 is optically connected to the optical bias module 12 through a polarization plane preserving optical fibre 14

The optical bias module 12 is configured to include a birefringent element 12a, a lens 12b, a magnet 12c, and a Faraday rotator 12d. Similarly to the birefringent element 3, the birefringent element 12a is a uniaxial birefringent crystal having α=47.8 degrees, and rutile is used for the birefringent element 12a. The Faraday rotator 12d is an irreciprocal polarization plane rotation element, which is configured to include a ferromagnetic bismuth substituted type garnet having a Faraday rotation angle of 22.5 degrees when it is magnetically saturated by a magnetic field applied from the magnet 12c. The magnet 12c is a Sm—Co series or Nd—Fe—B series permanent magnet and has an outer shape of a ring and is deposed to surround the Faraday rotator 12d.

In addition, an ASE light source 15 having a wavelength band of 1550 nm is optically connected to the polarization depending type optical circulator 13 through the optical fibre 16. Each light beam is divided into two linearly polarized light beams by each of the optical bias module 12 and the polarization depending type optical circulator 13, and the linearly polarized light beams are detected through the optical fibres 17 and 18 by optical power meters (hereinafter, denoted by OPMs) 19 and 20. In this configuration of the optical system, the birefringence due to the optical fibre 2 is changed by a polarization controller 22 formed by winding the optical fibre 2 multiple times; and with respect to the above-described samples, the change widths of the linearly polarized light beams detected from the optical bias module 12 or the polarization depending type optical circulator 13 by the OPM 19 or the OPM 20 are compared. The detection result of the obtained change widths are listed in Table 1.

TABLE 1

| SAMPLE | OPM19 CHANGE WIDTH (dB) | OPM20 CHANGE WIDTH (dB) |
|---|---|---|
| OPTICAL FIBRE BIREFRINGENCE COMPENSATION MIRROR 10 | 0.006 | 0.004 |
| OPTICAL FIBRE BIREFRINGENCE COMPENSATION MIRROR 1 | 0.118 | 0.117 |
| OPTICAL FIBRE MIRROR 11 | 0.394 | 0.372 |
| OPTICAL FIBRE MIRROR 7 | 29.365 | 10.350 |

It can be concluded from Table 1 that the change widths of the optical fibre birefringence compensation mirror 1 and the optical fibre birefringence compensation mirror 10 are further suppressed in comparison with the Faraday mirror 11 and the mirror 7, so that the influence of the birefringence due to the optical fibre 2 is suppressed. Moreover, with respect to the optical fibre birefringence compensation mirror 1 and the optical fibre birefringence compensation mirror 10, since the change width of the optical fibre birefringence compensation mirror 10 is more greatly suppressed in comparison with the optical fibre birefringence compensation mirror 1, it can be understood that the optical fibre birefringence compensation mirror 10 is most preferable in terms of the suppression of the birefringence due to the optical fibre 2.

Example 2

Figure 10:
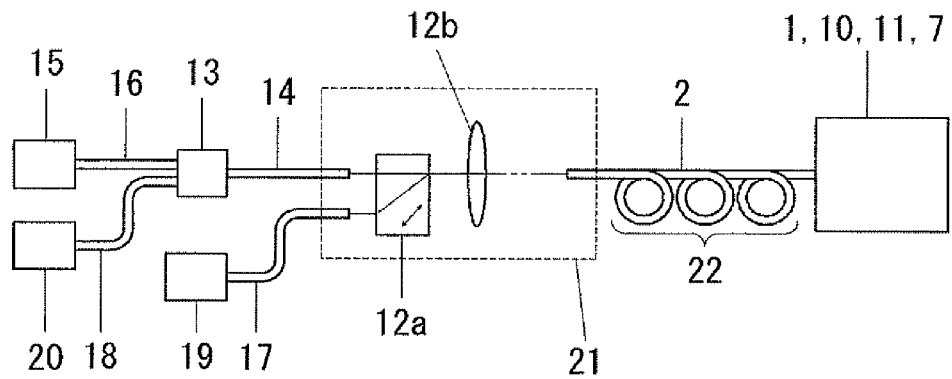
FIG. 10 is a diagram illustrating a configuration of an optical system according to Example 2.

The optical fibres 2 for the optical fibre birefringence compensation mirror 1, the optical fibre birefringence compensation mirror 10, the Faraday mirror 11, and the mirror 7 are uniformly adopted, or used in a single mode type quartz-based optical fibre, and the components are optically connected to a polarization division/combination unit 21 through the optical fibre 2 illustrated in FIG. 10. In addition, in FIG. 10, the same elements as those of the optical system of the above-described Example 1 are denoted by the same reference numerals, and redundant description thereof is not repeated or is simplified.

The Example 2 illustrated in FIG. 10 is different from the Example 1 illustrated in FIG. 9 in that the polarization division/combination unit 21 is provided instead of the optical bias module 12. The polarization division/combination unit 21 is an optical unit having a configuration where the magnet 12c and the Faraday rotator 12d are removed from the optical bias module 12.

Similarly to Example 1, in this optical system, the birefringence due to the optical fibre 2 is changed by the polarization controller 22; and with respect to the above-described samples, the change widths of the linearly polarized light beams detected from the optical bias module 12 or the polarization depending type optical circulator 13 by the OPM 19 or the OPM 20 are compared. The detection result of the obtained change widths are listed in Table 2.

TABLE 2

| SAMPLE | OPM19 CHANGE WIDTH (dB) | OPM20 CHANGE WIDTH (dB) |
|---|---|---|
| OPTICAL FIBRE BIREFRINGENCE COMPENSATION MIRROR 10 | 0.002 | 0.007 |
| OPTICAL FIBRE BIREFRINGENCE COMPENSATION MIRROR 1 | 0.016 | 0.170 |
| OPTICAL FIBRE MIRROR 11 | 0.040 | 0.272 |
| OPTICAL FIBRE MIRROR 7 | 38.089 | 12.363 |

It can be concluded from Table 2 that the change widths of the optical fibre birefringence compensation mirror 1 and the optical fibre birefringence compensation mirror 10 are further suppressed in comparison with the Faraday mirror 11 and the mirror 7, so that the influence of the birefringence due to the optical fibre 2 is suppressed. Moreover, with respect to the optical fibre birefringence compensation mirror 1 and the optical fibre birefringence compensation mirror 10, since the change width of the optical fibre birefringence compensation mirror 10 is more greatly suppressed in comparison with the optical fibre birefringence compensation mirror 1, it can be understood that the optical fibre birefringence compensation mirror 10 is most preferable in terms of the suppression of the birefringence due to the optical fibre 2.

Example 3

Figure 11:
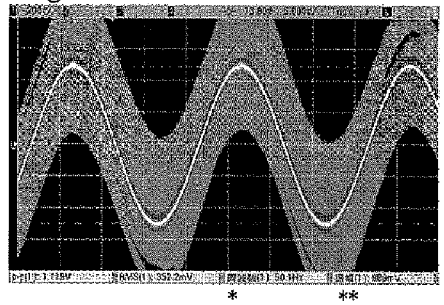
FIG. 11 is a diagram illustrating a change in a measured current waveform of a current sensor configured with a mirror 7 according to Example 3.
Figure 12:
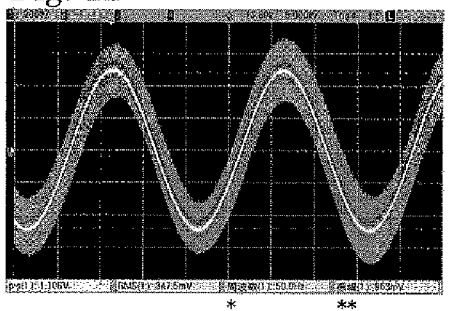
FIG. 12 is a diagram illustrating a change in a measured current waveform of a current sensor configured with a Faraday mirror 11 according to Example 3.
Figure 13:
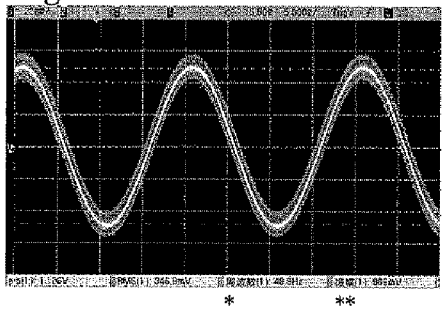
FIG. 13 is a diagram illustrating a change in a measured current waveform of a current sensor configured with an optical fibre birefringence compensation mirror 1 according to Example 3.
Figure 14:
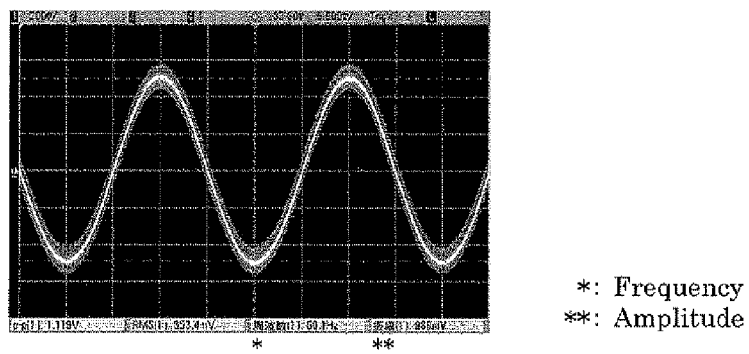
FIG. 14 is a diagram illustrating a change in a measured current waveform of a current sensor configured with an optical fibre birefringence compensation mirror 10 according to Example 3.

The optical fibres 2 for the optical fibre birefringence compensation mirror 1, the optical fibre birefringence compensation mirror 10, the Faraday mirror 11, and the mirror 7 are uniformly adopted in a single mode type optical fibre, and a current sensor is formed by installing a current conducting wire to surround the optical fibre 2. In addition, by applying external vibration to the optical fibre 2, change (gray portion) in the measured current waveform of each of the current sensors is detected. The result of change in the measured current waveform of the mirror 7 is illustrated in FIG. 11; the result of change in the measured current waveform of the Faraday mirror 11 is illustrated in FIG. 12; the result of change in the measured current waveform of the optical fibre birefringence compensation mirror 1 is illustrated in FIG. 13; and the result of change in the measured current waveform of the optical fibre birefringence compensation mirror 10 is illustrated in FIG. 14.

It can be seen from FIGS. 11 to 14 that the optical fibre birefringence compensation mirror 10 has the most preferable configuration in that a change in a waveform of the optical fibre birefringence compensation mirror 10 is suppressed down to a minimum level and the vibration resistance of the current sensor is improved.

INDUSTRIAL APPLICABILITY

An optical fibre birefringence compensation mirror according to the present invention can be used for a current sensor, a magnetic field sensor, a quantum cryptography device, an optical switch, a light source, an amplifier, an interferometer, an add-drop, and the like. In addition, a current sensor according to the present invention can be used to sense a current value of a power system.

The invention claimed is:

1. An optical fibre birefringence compensation mirror comprising:
   an optical fibre;
   a birefringent element;
   a lens;
   a magnet;
   a Faraday rotator which is applied with a magnetic field from the magnet to be magnetically saturated and has a Faraday rotation angle of 45 degrees; and
   a mirror,
   wherein components of the birefringent element, the Faraday rotator, and the mirror are disposed in the order of the birefringent element, the Faraday rotator, and the mirror from a light incidence/emission end surface of the optical fibre,
   the optical fibre is of a single mode type,
   a light beam propagating through the optical fibre is divided into two perpendicular linearly polarized light beams of an ordinary ray and an extraordinary ray by the birefringent element to be condensed by the lens,
   the two linearly polarized light beams transmit through the Faraday rotator, therefore polarization planes thereof are rotated by 45 degrees, and the two linearly polarized light beams are reflected at one point on a surface of the mirror in points symmetry,
   the two reflected linearly polarized light beams re-transmit through the Faraday rotator, therefore the polarization planes of the two linearly polarized light beams are further rotated by 45 degrees,
   the two linearly polarized light beams are incident on the birefringent element again, consequently one light beam is re-combined,
   the re-combined light beam is incident on the optical fibre, and
   a shift amount of the extraordinary ray in the birefringent element is equal to or larger than twice a mode field diameter of the optical fibre.

2. A current sensor, wherein the optical fibre of the optical fibre birefringence compensation mirror according to claim 1 is optically connected to an optical fibre for the current sensor which is installed to a conductor flowing a current and measures the current flowing through the conductor.

3. An optical fibre birefringence compensation mirror comprising:
   an optical fibre;
   a first birefringent element;
   a second birefringent element;
   a lens;
   a magnet;
   a Faraday rotator which is applied with a magnetic field from the magnet to be magnetically saturated and has a Faraday rotation anole of 45 degrees; and
   a mirror,
   wherein components of the first birefringent element, the second birefringent element, the Faraday rotator and the mirror are disposed in the order of the first birefringent element the second birefringent element, the Faraday rotator, and the mirror from a light incidence/emission end surface of the optical fibre,
   the optical fibre is of a single mode type,
   the direction of the crystal axis of an optical plane of the second birefringent element is set to be different by 90 degrees from the direction of the crystal axis of an optical plane of the first birefringent element,
   a light beam propagating through the optical fibre is divided into two perpendicular linearly polarized light beams of an ordinary ray and an extraordinary ray by the first birefringent element,
   when the two linearly polarized light beams transmitting through the first birefringent element transmit through the second birefringent element, the light beam transmitting through the first birefringent element as the ordinary ray transmits as the extraordinary ray and the light beam transmitting through the first birefringent element as the extraordinary ray transmit as the ordinary ray, and the two linearly polarized light beams are condensed by the lens,
   a shift amount of the extraordinary ray during the transmission through the first birefringent element and a shift amount of the extraordinary ray during the transmission through the second birefringent element are set to be the same,
   the two linearly polarized light beams transmit through the Faraday rotator, therefore polarization planes thereof are rotated by 45 degrees, and the two linearly polarized light beams are reflected at one point on a surface of the mirror in point symmetry,
   the two reflected linearly polarized light beams re-transmit through the Faraday rotator, therefore the polarization planes of the two linearly polarized light beams are further rotated by 45 degrees, when the two linearly polarized la ht beams transmitting throe h the Faraday rotator transmit through the second birefringent element, only one linearly polarized light beam is shifted, the two linearly polarized light beams are incident on the first birefringent element again, and when the two linearly polarized light beams transmitting through the second birefringent element transmit through the first birefringent element the light beam transmitting through the second birefringent element as the ordinary ray transmits as the extraordinary ray and the light beam transmitting through the second birefringent element as the extraordinary ray transmits as the ordinary ray consequently the only one linearly polarized light beam is shifted and the two linearly polarized light beams is re-combined as one light beam, the re-combined light beam is incident on the optical fibre, and a sum of the shift amount of the extraordinary ray in the first birefringent element and the shift amount of the extraordinary ray in the second birefringent element is equal to or larger than twice a mode field diameter of the optical fibre.

4. The optical fibre birefringence compensation mirror according to claim 3, wherein the optical path length difference between the two linearly polarized light beams generated through the division of the ordinary ray and the extraordinary ray at the time of transmitting the second birefringent element is set to be the same as the optical path length difference between the two linearly polarized light beams generated through the division of the ordinary ray and the extraordinary ray at the time of transmitting the first birefringent element.

5. A current sensor, wherein the optical fibre of the optical fibre birefringence compensation mirror according to claim 4 is optically connected to an optical fibre for the current sensor which is installed to a conductor flowing a current and measures the current flowing through the conductor.

6. A current sensor, wherein the optical fibre of the optical fibre birefringence compensation mirror according to claim 3 is optically connected to an optical fibre for the current sensor which is installed to a conductor flowing a current and measures the current flowing through the conductor.

* * * * *